(12) United States Patent
Armstrong et al.

(10) Patent No.: US 7,812,247 B2
(45) Date of Patent: Oct. 12, 2010

(54) FLEXIBLE PHOTOVOLTAIC ARRAY WITH INTEGRATED WIRING AND CONTROL CIRCUITRY, AND ASSOCIATED METHODS

(75) Inventors: Joseph H. Armstrong, Littleton, CO (US); Matthew B. Foster, Lone Tree, CO (US); Jonathan S. Port, Pacific Palisades, CA (US); Douglas G. Jensen, Lakewood, CO (US)

(73) Assignees: Ascent Solar Technologies Inc., Littleton, CO (US); Permacity Corp, Los Angeles, CA (US)

( * ) Notice: Subject to any disclaimer, the term of this patent is extended or adjusted under 35 U.S.C. 154(b) by 408 days.

(21) Appl. No.: 11/877,625

(22) Filed: Oct. 23, 2007

(65) Prior Publication Data

US 2008/0099062 A1    May 1, 2008

Related U.S. Application Data

(60) Provisional application No. 60/853,609, filed on Oct. 23, 2006, provisional application No. 60/853,610, filed on Oct. 23, 2006.

(51) Int. Cl.
 *H01L 31/042* (2006.01)
(52) U.S. Cl. ................................. 136/244; 136/293
(58) Field of Classification Search ................ 136/244, 136/293
 See application file for complete search history.

(56) References Cited

U.S. PATENT DOCUMENTS

| 4,617,421 | A | 10/1986 | Nath et al. |
| 4,724,010 | A | 2/1988 | Okaniwa et al. |
| 4,860,509 | A | 8/1989 | Laaly et al. |
| 5,990,414 | A * | 11/1999 | Posnansky ............ 136/244 |
| 5,998,729 | A | 12/1999 | Shiomi et al. |
| 6,093,884 | A * | 7/2000 | Toyomura et al. ......... 136/244 |
| 6,295,818 | B1 | 10/2001 | Ansley et al. |
| 6,310,281 | B1 | 10/2001 | Wendt et al. |
| 6,311,436 | B1 | 11/2001 | Mimura et al. |
| 6,372,538 | B1 | 4/2002 | Wendt et al. |

(Continued)

FOREIGN PATENT DOCUMENTS

JP    61082485 A  *  4/1986

(Continued)

OTHER PUBLICATIONS

Prometheus Institute, The Future of Thin Film PV, PVNews, Aug. 2006, pp. 3-5.

(Continued)

*Primary Examiner*—Jessica L Ward
*Assistant Examiner*—Jacky Yuen
(74) *Attorney, Agent, or Firm*—Lathrop & Gage LLP

(57) ABSTRACT

A flexible photovoltaic module for converting light into electricity includes a plurality of photovoltaic cells, a wiring harness, and a connection subsystem. The plurality of photovoltaic cells are electrically interconnected to form a positive node for supplying current to a load and a negative node for receiving current from the load. The wiring harness includes a plurality of flexible electrical conductors, each electrical conductor being electrically isolated within the wiring harness. The connection subsystem is operable to selectively connect the positive node to one of the electrical conductors of the wiring harness. A plurality of flexible photovoltaic modules may be connected to form a photovoltaic array.

14 Claims, 11 Drawing Sheets

U.S. PATENT DOCUMENTS

| | | | |
|---|---|---|---|
| 6,465,724 B1 * | 10/2002 | Garvison et al. | ............ 136/244 |
| 6,472,593 B1 | 10/2002 | Middelman et al. | |
| 6,675,580 B2 | 1/2004 | Ansley et al. | |
| 6,729,081 B2 | 5/2004 | Nath et al. | |
| 7,019,207 B2 | 3/2006 | Harneit et al. | |
| 7,271,333 B2 | 9/2007 | Fabick et al. | |
| 2001/0045228 A1 | 11/2001 | Takada et al. | |
| 2001/0050102 A1 * | 12/2001 | Matsumi et al. | ............ 136/244 |
| 2002/0046764 A1 | 4/2002 | Ansley et al. | |
| 2003/0068559 A1 | 4/2003 | Armstrong et al. | |
| 2005/0012021 A1 | 1/2005 | Middelman et al. | |
| 2005/0115176 A1 | 6/2005 | Russell | |
| 2005/0133082 A1 | 6/2005 | Konold et al. | |
| 2005/0224108 A1 | 10/2005 | Cheung et al. | |

FOREIGN PATENT DOCUMENTS

| | | | |
|---|---|---|---|
| JP | 08186280 A | * | 7/1996 |
| JP | 10135499 A | * | 5/1998 |
| JP | 2002009326 A | * | 1/2002 |
| JP | 2003298100 A | * | 10/2003 |
| WO | WO 2009/011790 | | 1/2009 |

OTHER PUBLICATIONS

Barnubus Energy Inc., SolarSave Photovoltaic Modules, Dr. Heshmat Laaly, Research & Development, www.barnabusenergy.com, retrieved from website, Sep. 27, 2006, pp. 1-5.

Islam, S. & Belmans, R., Field Testing of Plug and Play Type AC Modules: Performance and Monitoring Results, Aug. 10, 2001, pp. 1-12.

Miasole Closes $5.4 Million in Funding, Appoints New Member to Board of Disclosures, www.prnewswire.com, retrieved on Sep. 20, 2006.

Photo-Voltaic Manufacturing Technology Fact Sheet, Iowa Thin Film Technologies, Inc., Jul. 2000, pp. 1-2.

Gartner, John, Solar To Keep Army On The Go, www.Rense.com, Wired News, Jun. 29, 2004, pp. 1-3.

Solar Roofing Systems, Inc., Product Specifications, SolarSave, Premiere Series, Solar Electric Roofing Modules, Model SP480, www.solarsave.com, pp. 1-2.

Powerfilm Solar, Technical Data Sheet, Military Solar Quadrant, Field Shelter With Integrated Solar Power—190 Watts., www.powerfilmsolar.com, PowerFilm Solar, Aug. 9, 2005, p. 1.

Powerfilm Solar, Technical Data Sheet, Military Solar Temper Fly, Field Shelter With Integrated Solar Power—750 Watts., www.powerfilmsolar.com, PowerFilm Solar, Aug. 9, 2005, p. 1.

Powerfilm Solar, Technical Data Sheet, Military Solar Power Shade, Field Shelter With Integrated Solar Power—1 Kilowatt, www.powerfilmsolar.com, PowerFilm Solar, Aug. 9, 2005, p. 1.

Powerfilm Solar, Technical Data Sheet, Military Solar Power Shade, Medium, Field Shelter With Integrated Solar Power—2 Kilowatt, www.powerfilmsolar.com, PowerFilm Solar, Aug. 9, 2005, p. 1.

Uni-Solar, Flexible Solar Panels, www.alphasolar.com, retrieved from website, Sep. 20, 2006, p. 1.

Bower, W., The AC Building Block—Ultimate Plug-n-Play That Brings Photovoltaics Directly To The Customer, Sandia National Laboratories, Albuquerque, NM, NREL/CD-520-33588, 2003, pp. 311-314.

U.S. Appl. No. 11/877,632 Response to Office Action filed Mar. 1, 2010, 13 pages.

U.S. Appl. No. 11/877,632 Office Action mailed May 26, 2010, 25 pages.

U.S. Appl. No. 11/877,632 Office Action mailed Sep. 1, 2009, 20 pages.

* cited by examiner

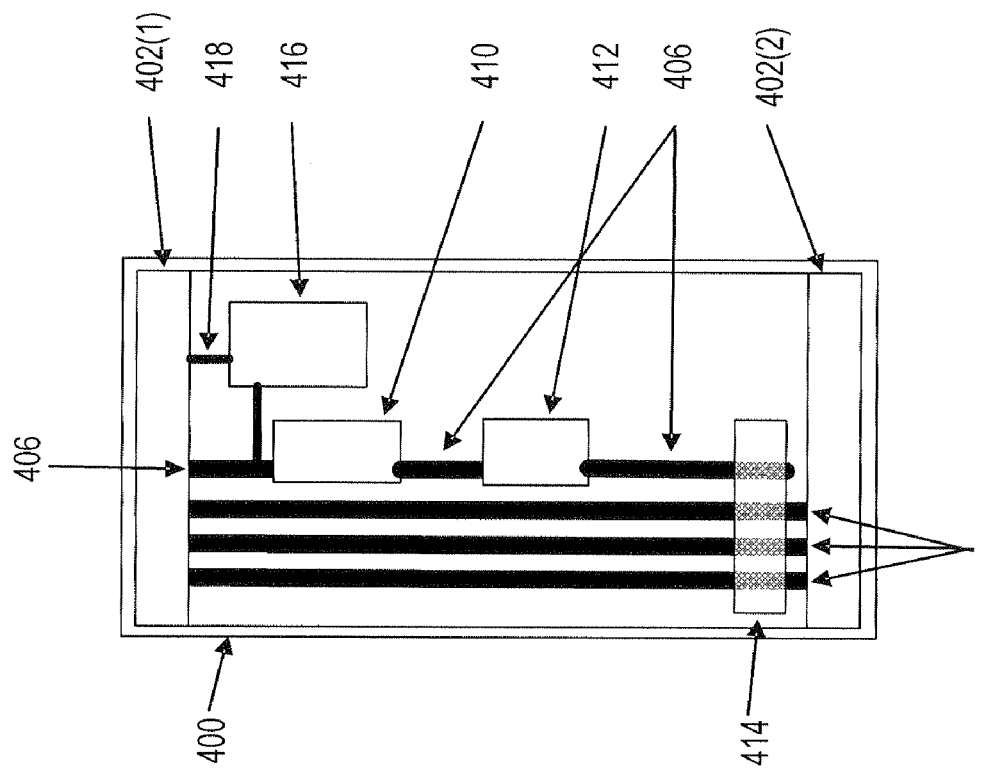
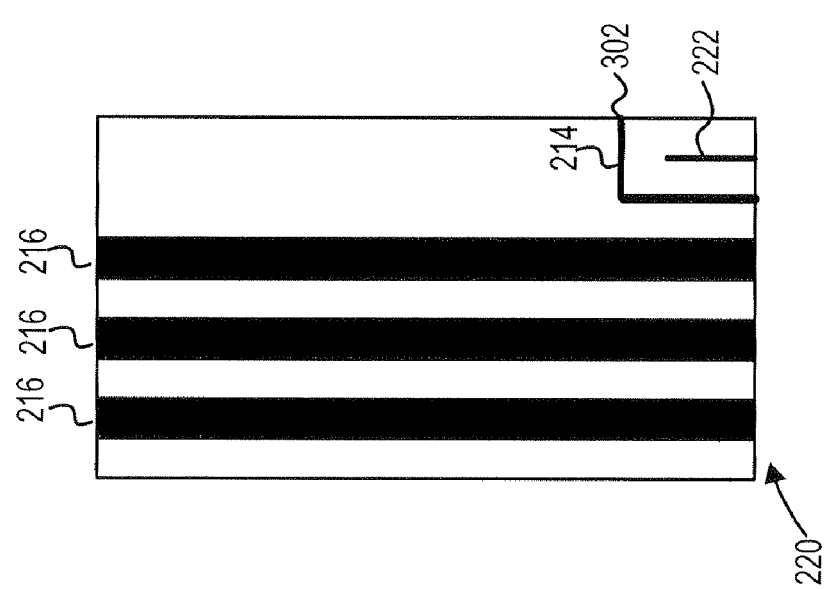

FLEXIBLE PHOTOVOLTAIC ARRAY WITH INTEGRATED WIRING AND CONTROL CIRCUITRY, AND ASSOCIATED METHODS

CROSS REFERENCE TO RELATED APPLICATIONS

This application claims benefit of priority to U.S. Provisional Patent Application Ser. No. 60/853,609 filed 23 Oct. 2006 and U.S. Provisional Patent Application Ser. No. 60/853,610 filed 23 Oct. 2006. Each of the aforementioned applications are incorporated herein by reference.

BACKGROUND

Photovoltaic solar power systems are an increasingly attractive alternative to using legacy power generating technologies due to growing concerns about the sustainability and cost of such legacy technologies. However, limitations of commercially available photovoltaic solar power systems have prevented their widespread acceptance and use.

Conventional photovoltaic solar power systems are typically complicated and expensive to install. They are often weighty and cumbersome, and may require special support structures. For example, when a conventional solar power system is installed on a building's roof, special support structures may be required to support the power system. Additionally, a conventional solar power system may significantly increase a roof's weight and/or wind load when installed on the roof. In some cases, the quantity of modules needed to generate the desired power would exceed the roof's rated structural limits, thereby preventing the installation of the required photovoltaic solar power system.

The installation of such conventional solar power systems is in itself problematic. Conventional solar power systems are typically built from a large number of rigid, heavy photovoltaic modules of relatively low voltage and power, that are frequently difficult to transport and maneuver. The photovoltaic modules must be delivered to an installation site, individually disposed in their proper locations at the installation site, and individually connected with cables, wires, breakers, boxes, combiners, and/or connectors. Furthermore, due to their low voltage and relatively low power output, there is generally a need to wire a large number of photovoltaic modules in series and/or in parallel. Photovoltaic modules need to be wired in series to achieve a desired open circuit output voltage, and photovoltaic modules need to be wired in parallel to achieve a given current rating for the overall system. Typically, for a given circuit, a plurality of modules are connected in series, referred to as a string, to achieve the desired voltage, and in turn, several of these strings are connected in parallel to achieve the desired current for this circuit. Therefore, installation of conventional solar power systems is generally labor intensive, complex, and costly.

Additionally, the multitude of components required in traditional solar power systems (e.g., cables, wires, breakers, boxes, combiners, and connectors) increase the complexity of the system, which may decrease its reliability and/or increase its maintenance requirements. Furthermore, the cost of such multitude of components is often significant, thereby contributing to the relative costliness of traditional solar power systems.

Conventional photovoltaic solar power systems are also frequently difficult to adapt to topographical features of real world installation sites, thereby limiting their adoption. Installation sites often contain obstructions (e.g., a roof may contain vents, skylights, heating, ventilation and air conditioning (HVAC) equipment) which limit a contiguous area available for disposing photovoltaic modules thereon. Further complicating these installations is that by necessity, the PV array must be oriented to accept the sun's rays most directly, while the building's rooftop is not always oriented to easily accommodate this requirement. Accordingly, solar power systems must be built around such obstructions. However, components of conventional solar power systems generally have fixed dimensions, which prevents them from being customized to a particular installation site to work around obstructions. For example, if a roofs surface is broken up by two plumbing vents, conventional solar power system components may not be available in suitable dimensions to be disposed between the plumbing vents.

Furthermore, as described above, a certain quantity of traditional photovoltaic modules of conventional solar power systems must be connected in series to achieve a desired output voltage, thereby limiting flexibility in disposing the components in an installation site. For example, consider a roof broken up by a chimney. In order to work around the chimney while still connecting enough traditional photovoltaic modules in series to achieve a required open circuit output voltage, one or more component photovoltaic modules in a string may be placed away from its fellow, series-connected photovoltaic modules. This requires additional wiring, and may result in sub-optimal coverage over an installation site.

SUMMARY

A photovoltaic array includes a flexible first photovoltaic module and a flexible second photovoltaic module for converting light into electricity. The first photovoltaic module has a positive node for supplying electric current to a load and a negative node for receiving electric current from the load. The first photovoltaic module includes a first wiring harness having a plurality of flexible electrical conductors, each electrical conductor being electrically isolated from each other electrical conductor within the first wiring harness. The positive node of the first photovoltaic module is electrically connected to one of the electrical conductors of the first wiring harness, and the remaining electrical conductors of the first wiring harness are electrically isolated from the positive and negative nodes of the first photovoltaic module.

The second photovoltaic module has a positive node for supplying electric current to a load and a negative node for receiving electric current from the load. The second photovoltaic module includes a second wiring harness having a plurality of flexible electrical conductors corresponding to the electrical conductors of the first wiring harness. Each electrical conductor is electrically isolated from each other electrical conductor within the second wiring harness. The positive node of the second photovoltaic module is electrically connected to one of the electrical conductors of the second wiring harness, and the remaining electrical conductors of the second wiring harness are electrically isolated from the positive and negative nodes of the second photovoltaic module. The electrical conductors of the first wiring harness are electrically connected to the corresponding electrical conductors of the second wiring harness.

A flexible photovoltaic module for converting light into electricity includes a plurality of photovoltaic cells, a wiring harness, and a connection subsystem. The plurality of photovoltaic cells are electrically interconnected to form a positive node for supplying current to a load and a negative node for receiving current from the load. The wiring harness includes a plurality of flexible electrical conductors, each electrical conductor being electrically isolated within the wiring harness. The connection subsystem is operable to selectively connect the positive node to one of the electrical conductors of the wiring harness.

A process for forming a solar power electrical generation system at an installation site includes the following steps. A first photovoltaic module is disposed at the installation site, where the first photovoltaic module includes a first wiring harness having a plurality of first electrical conductors and a first control box in electrical communication with the first electrical conductors. A second photovoltaic module is also disposed at the installation site proximate to the first photovoltaic module. The second photovoltaic module includes a second wiring harness having a plurality of second electrical conductors corresponding to the first electrical conductors. The second photovoltaic module further includes a second control box in electrical communication with the second electrical conductors.

The second electrical conductors of the second wiring harness are electrically connected to the corresponding first electrical conductors of the first wiring harness using the control box as a connection point. A positive node of the first photovoltaic module is electrically connected to one of the first electrical conductors of the first wiring harness using a selector switch of the first control box. A positive node of the second photovoltaic module is electrically connected to one of the second electrical conductors of the second wiring harness using a selector switch of the second control box.

BRIEF DESCRIPTION OF DRAWINGS

FIG. 3 is a top cross sectional view of one embodiment of the wiring harness of the photovoltaic module of FIG. 2.

FIG. 4 is a block diagram of one control box for interconnecting a plurality of photovoltaic modules, according to an embodiment.

DETAILED DESCRIPTION

Figure 1:
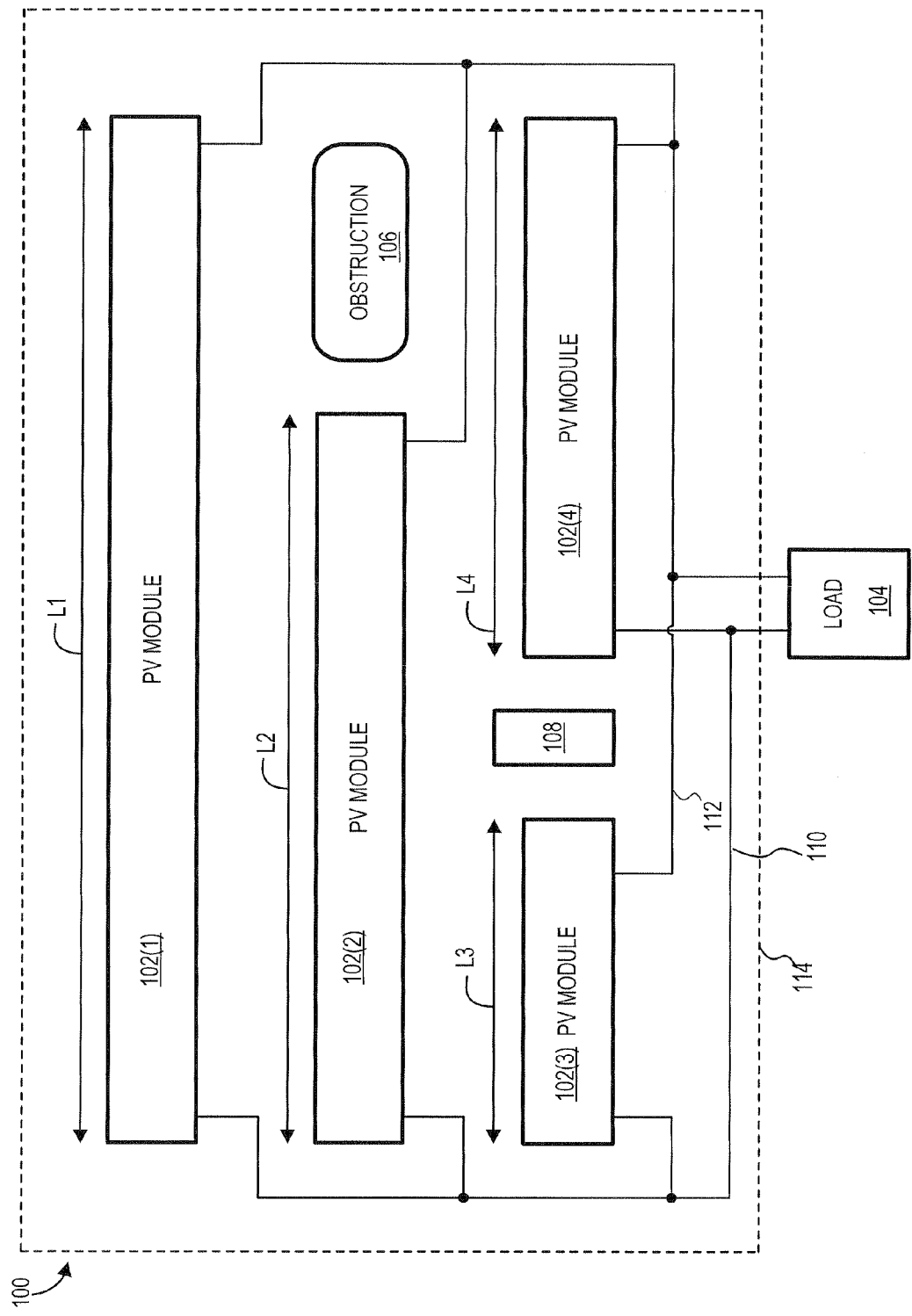
FIG. 1 is a top plan view of one solar power generation system, according to an embodiment.

It is noted that, for purposes of illustrative clarity, certain elements in the drawings may not be drawn to scale. Specific instances of an item may be referred to by use of a numeral in parentheses (e.g., photovoltaic module 102(1)) while numerals without parentheses refer to any such item (e.g., photovoltaic modules 102).

FIG. 1 is a top plan view of one solar power generation system 100 which generates direct current or alternating current electricity from sunlight or other forms of light (e.g., light from an artificial light source). Solar power generation system 100 powers, for example, load 104, and is installed in an installation area 114. Examples of installation area 114 include a building's roof, an outer surface of a vehicle (e.g., a spacecraft), and a solar power farm. Ideally, installation area 114 is free of obstructions that interfere with placement of components of solar power generation system 100. However, installation area 114 may, and often does, contain obstructions. For example, FIG. 1 illustrates installation area 114 including obstructions 106 and 108. If installation area 114 is a building's roof, obstructions 106 and 108 could be skylights, HVAC units, chimneys, plumbing vents, etc. As another example, if installation area 114 is considered to be a spacecraft's outer surface, obstructions 106 and 108 could be considered to be communication antennas, windows, propulsion equipment, etc.

Solar power generation system 100 includes at least one photovoltaic module 102, each of which converts incident light into direct current or alternating current electricity. Each photovoltaic module 102 has a positive node through which the photovoltaic module provides electric current to a load, and each photovoltaic module 102 has a corresponding negative node through which the photovoltaic module receives return electric current from the load. Positive nodes of each photovoltaic module 102 are electrically connected to load 104 via connectors 110, and negative nodes of each photovoltaic module 102 are connected to load 104 via connectors 112.

Solar power generation system 100 is illustrated as including four photovoltaic modules 102(1), 102(2), 102(3), and 102(4). However, solar power generation system 100 is modular in that photovoltaic modules 102 may be added to or removed from solar power generation system 100 as its application requires. For example, if an application requires additional electric power, additional photovoltaic modules 102 may be added to power generation system 100. Conversely, if an application requires less electric power or an installation area 114 does not contain sufficient space to dispose each of photovoltaic modules 102(1), 102(2), 102(3), and 102(4), one or more photovoltaic modules 102 may be removed.

As discussed below, embodiments of photovoltaic modules 102 are flexible, allowing for placement of photovoltaic modules 102 on non-planar surfaces. Such optional flexibility of photovoltaic modules 102 may also facilitate their transportation and installation—for example, they may be rolled-up for ease of transportation. Furthermore, embodiments of photovoltaic modules 102 have customizable lengths and/or widths allowing photovoltaic modules 102 to be sized for installation site 114. For example, as illustrated in FIG. 1, photovoltaic module 102(2) has a length L2 that is shorter than length L1 of photovoltaic module 102(1) in order to accommodate obstruction 106. Similarly, photovoltaic modules 102(3) and 102(4) have respective lengths L3 and L4 that are sufficiently short to accommodate obstruction 108.

Embodiments of photovoltaic modules 102 have essentially identical open circuit output voltages despite variations in their dimensions. Photovoltaic modules 102(1), 102(2), 102(3) and 102(4), for example, have essentially the same open circuit output voltage even though they have different lengths. This feature may advantageously reduce or eliminate the need to electrically connect photovoltaic modules 102 in series, thereby reducing installation complexity and cost. Embodiments of photovoltaic modules 102 also have a relatively high open circuit output voltage (e.g., 480 volts or 600 volts), which may also eliminate the need to connect photovoltaic modules in series. For example, FIG. 1 illustrates each photovoltaic module 102 being electrically connected in parallel to load 104 by connectors 110 and 112. However, it should be noted that if photovoltaic modules 102 have different dimensions, they may have different maximum current capabilities because current capability is commonly proportional to surface area of the photovoltaic module.

Figure 2:
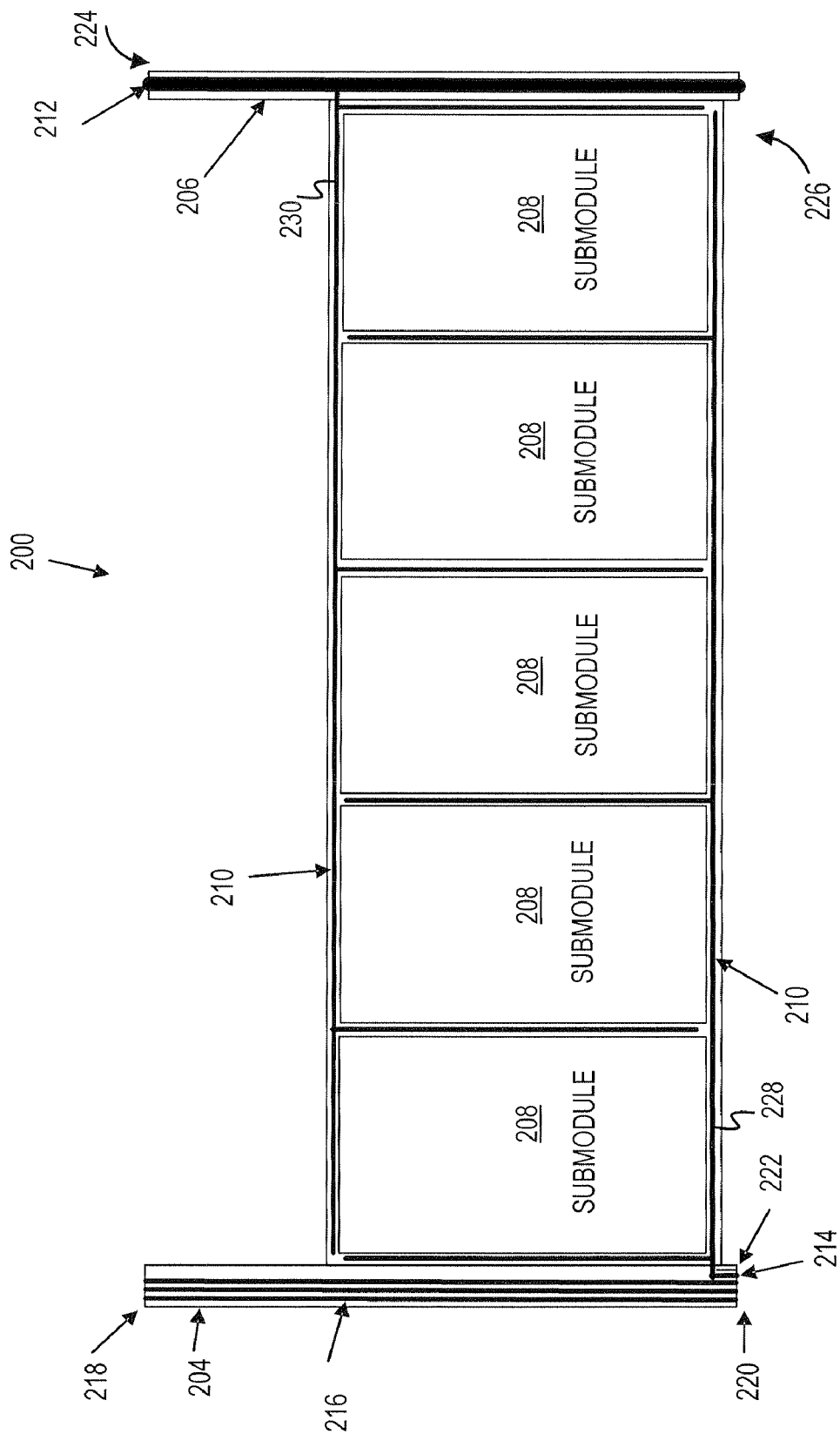
FIG. 2 is a top plan view of one flexible photovoltaic module, according to an embodiment.

FIG. 2 is a top plan view of one flexible photovoltaic module 200, which is an embodiment of photovoltaic module 102 of FIG. 1. Photovoltaic module 200 includes one or more photovoltaic submodules 208, wiring harness 204, and ground wiring harness 206. Embodiments of photovoltaic module 200 may be capable of producing an output power of up to 5,000 watts, and embodiments of photovoltaic module 200 may have a relatively high open circuit output voltage (e.g., 360 volts, 480 volts, or 600 volts) which may eliminate the need connect a plurality of photovoltaic modules 200 in series to achieve a desired open circuit output voltage. While it is possible to create photovoltaic modules with similar high power and/or high open circuit output voltage ratings using traditional, rigid PV technology, such photovoltaic modules would be completely impractical, both in terms of dimensions and weight. In contrast, embodiments of photovoltaic module 200 with high power and/or high open circuit output voltage ratings may be rolled-up in a compact form for ease of transportation; furthermore, such embodiments may weigh significantly less that rigid photovoltaic modules with similar output characteristics.

In embodiments of photovoltaic module 200, photovoltaic submodules 208 are thin-film photovoltaic devices, which may created of materials including, but not limited to, copper-indium-gallium-selenium (CIGS), copper-indium-gallium-selenium-sulfur (CIGSS), copper-indium-aluminum-selenium (CIAS), copper-indium-gallium-aluminum-selenium (CIGAS), copper-indium-gallium-aluminum-selenium-sulphur (CIGASS), cadmium-telluride (CdTe), amorphous silicon (a-Si), or combinations thereof. Furthermore, in embodiments of photovoltaic module 200, photovoltaic submodules 208 are monolithically integrated onto a common substrate. For example, one embodiment of photovoltaic module 200 has a single monolithically-integrated thin-film photovoltaic submodule 208 with multiple CIGS cells. As another example, another embodiment of photovoltaic module 200 includes a plurality of discrete, interconnected photovoltaic submodules 208 of photovoltaic cells that are printed or manufactured (e.g., by a roll-to-roll process) on a substrate common to the submodule.

In embodiments where photovoltaic submodules 208 are thin-film monolithically-integrated photovoltaic devices, the monolithic integration process may be computer controlled. A multitude of different monolithic integration patterns may be chosen to provide a given open circuit voltage and maximum current rating. Scribes delineating a plurality of photovoltaic submodules 208 on a common substrate may be placed parallel and/or perpendicular to the web transport direction. Photovoltaic submodules 208 may be the size of the entire photovoltaic module 200 such that photovoltaic module 200 has one submodule 208, or photovoltaic submodules 208 may be scribed into smaller units on a common substrate. An optimum size and configuration of submodules 208 is determined, for example, through cost and/or performance modeling of the submodules.

Conductive bus bars 210 electrically connect photovoltaic submodules 208 to each other in a variety of configurations (e.g., parallel and/or series) to establish positive node 228 and negative node 230 of photovoltaic module 200. Photovoltaic module 200 supplies current to a load from positive node 228, and photovoltaic module 200 receives corresponding return current from the load from negative node 230. The configuration of bus bars 210 (e.g., whether photovoltaic submodules 208 are connected in parallel and/or series) partially determines the electrical characteristics of photovoltaic module 200. Bus bars 210, for example, connect photovoltaic submodules 208 to a ground conductor 212 formed with (e.g., sealed in) ground harness/jumper 206—thus, negative node 230 is electrically connected to ground conductor 212. Bus bars 210, for example, also electrically connect the photovoltaic submodules 208 to lead 214, which in turn may be connected to a flexible electrical conductor 216 within wiring harness 204 by a connection subsystem (not shown in FIG. 2), as discussed below. Thus, positive node 228 is electrically connected to lead 214 which in turn may be electrically connected to a flexible conductor 216.

Photovoltaic module 200 is illustrated in FIG. 2 as including five photovoltaic submodules 208 electrically connected in parallel by bus bars 210. Accordingly, the open circuit output voltage of photovoltaic module 200 is equal to the open circuit output voltage of each photovoltaic submodule 208, and the maximum current capability of photovoltaic module 200 is equal to five times the maximum current capability of each photovoltaic submodule 208. However, the configuration of bus bars 210 and photovoltaic submodules 208 shown in FIG. 1 is exemplary, and non-limiting. Photovoltaic submodules 208 may be electrically connected in series instead of in parallel to increase the open circuit output voltage of photovoltaic module 200. For example, three photovoltaic submodules 208, each having an open circuit output voltage of 120 volts, may be electrically connected in series such that photovoltaic module 200 has an open circuit output voltage of 360 volts and a maximum current capability equal to that of each photovoltaic submodule 208. Additionally, photovoltaic module 200 may include some instances of photovoltaic submodules 208 electrically connected in parallel and some instances of photovoltaic submodules 208 electrically connected in series to increase both the open circuit output voltage and maximum current capability of photovoltaic module 200. In all these cases, these submodules can be discrete or patterned on a single substrate. Furthermore, as noted above, embodiments of photovoltaic module 200 may contain solely one photovoltaic submodule 208.

In some applications of photovoltaic module 200, it is desired to have a relatively low voltage power supply available for housekeeping functions. In such embodiments, photovoltaic module 200 may include a low voltage tap across a subset of the module's photovoltaic cells to provide the low voltage power supply. The low voltage tap may connect to either positive node 228 or negative node 230 and an intermediate node, or the low voltage tap may connect to two intermediate nodes (i.e., the low voltage tap may be floating). For example, an embodiment of photovoltaic module 200 has an open circuit output voltage of 600 volts, but the module also requires an 18 volt power supply to power housekeeping (e.g., control and/or diagnostic) equipment. This exemplary module has 1,200 photovoltaic cells connected in series, where each photovoltaic cell has an open circuit output voltage of 0.5 volts such that the module's open circuit output voltage is 600 volts. The low voltage tap is this exemplary module is connected across 36 of the 1,200 photovoltaic cells to provide the 18 volt power supply.

Alternately, embodiments of photovoltaic module 200 include a DC-to-DC converter for powering a low voltage tap. In such embodiments, the DC-to-DC converter is powered from some or all of the photovoltaic cells of photovoltaic module 200. Further, as discussed below, embodiments of photovoltaic module 200 may include an inverter. In such embodiments, a transformer may be connected to an output of the inverter to provide a low voltage alternating current power supply to supply a low voltage tap. The output of such transformer may also be rectified and/or regulated (such as by an AC-to-DC converter or rectifier plus a DC-to-DC converter) before being fed to the low voltage tap.

Wiring harness 204 and ground wiring harness 206 may advantageously allow photovoltaic module 200 to be quickly connected to one or more additional instances of photovoltaic module 200 to form an array of photovoltaic modules 200. Not only may wiring harness 204 and ground wiring harness 206 respectively provide electrical interface to the positive node 228 and negative node 230 of photovoltaic module 200, they may also serve as conductors to carry electricity generated by a plurality photovoltaic modules 200 connected together in an array. Wiring harness 204 and ground wiring harness 206 may thereby replace external components such as wiring, connectors, junction boxes, breakers, etc. Stated differently, wiring harness 204 and ground wiring harness 206 may provide electrical distribution as well as electrical interface functions.

Wiring harness 204 includes one or more conductors 216 electrically isolated from each other within wiring harness 204. For example, wiring harness 216 is illustrated in FIG. 2 as including three conductors 216; however, wiring harness 216 can include any quantity of conductors 216. Each conductor may be used to establish a separate circuit. Positive node 228 of photovoltaic module 200 is electrically connected to one of the conductors 216 by a connection subsystem (not shown in FIG. 2), as discussed below. The additional conductors (if any) are used solely to carry electric current generated by other photovoltaic modules. Thus, in the embodiment illustrated in FIG. 2, positive node 228 of photovoltaic module 200 is connected to one conductor 216, and the remaining conductors 216 carry electric current generated by other interconnected photovoltaic modules. Jumper end 218 of wiring harness 204 may be used to connect photovoltaic module 200 to another photovoltaic module or to an electrical distribution system (e.g., a junction box). Control box interface end 220 of wiring harness 204 may be used to connect wiring harness 204 to a control box, as discussed below. Control box interface end 220 may include a quick-connect wiring connector (not shown in FIG. 2) to facilitate connection to a control box accepting the quick-connect wiring connector. Such quick-connect wiring connector allows a connection to be made without the use of solder or other time-consuming connection schemes. Wiring harness 204 may be formed having an excess length that can be trimmed at jumper end 218 to a length appropriate for the application of photovoltaic module 200.

FIG. 3 is a top cross sectional view of control box interface end 220 of one embodiment of wiring harness 204. Visible in FIG. 3 are three conductors 216, lead 214, and an optional low voltage tap lead 222. End 302 of lead 214 connects to positive node 228 of photovoltaic module 200. Optional low voltage tap lead 222 connects to a low voltage tap of photovoltaic module 200, and is used to provide housekeeping power to a control box connected wiring harness 204, as discussed below.

Ground wiring harness 206 (FIG. 2) includes ground conductor 212 for providing electrical interface to negative node 230 of photovoltaic module 200. Ground conductor 212 may also serve to transport electric current back to the negative nodes of other photovoltaic modules connected to photovoltaic module 200. Similar to wiring harness 204, ground wiring harness 206 includes jumper end 224 for connecting photovoltaic module 200 to another photovoltaic module or an electrical distribution system (e.g. a junction box). Grounding wiring harness 206 also includes connection box interface end 226 for connecting to a ground connection box (not shown in FIG. 2). Connection box interface end 226 may include a quick-connect wiring connector (not shown in FIG. 2) to facilitate connection to a ground connection box accepting the quick-connect wiring connector. Ground conductor 112 may be connected to a frame of photovoltaic module 200 or may be left floating, depending upon building code requirements. Ground wiring harness 206 may be formed having an excess length that can be trimmed by cutting jumper end 224 to a length appropriate for the application of photovoltaic module 200.

Although FIG. 2 illustrates wiring harness 204 and ground wiring harness 206 being disposed on opposite sides of photovoltaic module 200, each of the two wiring harnesses can be disposed on the same side of photovoltaic module 200. Furthermore, in embodiments of photovoltaic module 200, conductors 216 and ground conductor 212 are integrated within the same wiring harness (e.g., ground conductor 212 is integrated in wiring harness 204 along with conductors 216).

FIG. 4 is a block diagram of one control box 400, which is an embodiment of a connection subsystem for connecting positive node 228 of photovoltaic module 200 to a conductor 216 of wiring harness 204. Control box 400 is described herein with respect to components of photovoltaic module 200, and the following description may best be understood by considering FIGS. 2, 3, and 4 together.

Figure 5:
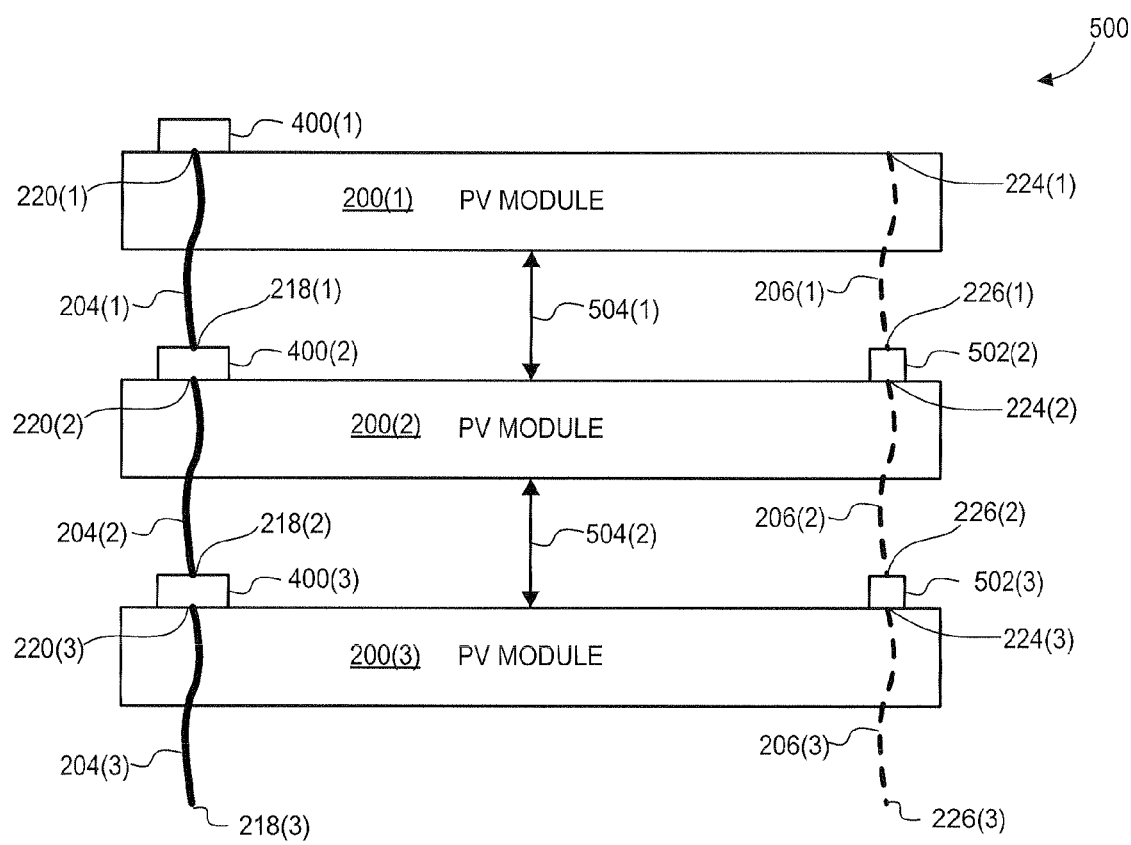
FIG. 5 is a top plan view of an array of the photovoltaic modules of FIG. 2, according to an embodiment.

Control box 400, for example, connects positive node 228 of photovoltaic module 200 to one or more of conductors 216 of wiring harness 204. Conductors 216 connect to one or more loads (e.g., an inverter), and conductors 216 may additionally connect to the positive nodes of one or more additional photovoltaic modules 200, as shown in FIG. 5 below. Therefore, control box 400 may connect together multiple photovoltaic modules 200 (e.g., via module-to-module connection).

Control box 400 includes conductors 404, which correspond to conductors 216 of wiring harness 204. For example, control box 400 is illustrated in FIG. 4 as including three conductors 404—therefore, control box 400 is intended to interface with an embodiment of wiring harness 204 including three conductors 216.

Control box 400 has a connection block 402(1) for connecting control box 400 to control box interface end 220 of wiring harness 204. Specifically, connection block 402(1) connects conductors 216 of wiring harness 204 to respective conductors 404 of control box 400. Connection block 402(1) further connects lead 214 of wiring harness 204 to conductor 406, and connection block 402(1) connects low voltage tap lead 222 of wiring harness 204 to low voltage lead 418. Connection block 402(1) may include quick-connect wiring connectors, crimp connectors, bolt or screw in connectors, solder connectors, braze connectors, and a push-in and capture connector.

Control box 400 also includes a connection block 402(2) for connecting conductors 404 to respective conductors 216 at jumper end 218 of a wiring harness 204 of another photovoltaic module 200. Alternately, connection block 402(2) may be used to connect conductors 404 to an electrical distribution system. Connection block 402(2) may include quick-connect connectors, crimp connectors, bolt or screw in connectors, solder connectors, braze connectors, and a push-in and capture connector.

Electrical switch 410 is electrically connected in series with conductor 406. Switch 410 is, for example, manually operated to disconnect photovoltaic module 200 from conductors 404 and thus from flexible conductors 216. Accordingly, switch 410 may be referred to as a disconnect switch. Current limiting device 412 is also connected in series with conductor 406. In an embodiment, current limiting device 412 prevents damage to photovoltaic module 200 and/or electrically interconnected components by preventing excess current from flowing through conductor 406 and thus through lead 214 and photovoltaic module 200. Current limiting device 412 may be a fuse or other apparatus for preventing current overload. Current limiting device 412 and switch 410 may be combined in a single device such as a circuit breaker.

Conductor 406 is electrically connected to selector switch 414. In one embodiment, selector switch 414 selectively connects conductor 406 to exactly one conductor 404, and thus electrically connects positive node 228 of photovoltaic module 200 to one flexible conductor 216. In other embodiments of control box 400, selector switch 414 is replaced with one or more jumper wires, solder terminals, and/or other electrical connectors to connect conductor 406 to one conductor 404. Selector switch 414 may advantageously allow an installer of photovoltaic module 200 to select which of conductors 216 (and thereby corresponding circuits) that positive node 228 of photovoltaic module 200 is electrically connected to by simply adjusting selector switch 414. Accordingly, the specific circuit that photovoltaic module 200 is electrically connected to may be adjusted without making wiring changes in embodiments of photovoltaic array 200 and control box 400. This feature may simplify installation and/or configuration of a solar power generation system that incorporates photovoltaic module 200.

Control box 400 optionally includes performance monitoring device 416 for monitoring the performance characteristics of photovoltaic module 200. Embodiments of monitoring device 416 may also store performance data and/or provide it to maintenance personnel. For example, monitoring device 416 may measure voltage and/or current generated by photovoltaic module 200, and/or the temperature of photovoltaic module 200. Monitoring device 416 may also function to detect theft of photovoltaic module 200 and/or damage to photovoltaic module 200. Performance data is, for example, retrieved from monitoring device 416 through wireless technology such as Radio Frequency Identification (RFID). Performance data may also be retrieved through a powerline network using conductors 404 and 216, or via a data network in communication with monitoring device 416. Monitoring device 416 is shown with low-voltage lead 418 for providing electrical power to monitoring device 416, and monitoring device 416 may be connected to conductor 406 to collect performance data. Control box 400 may also include a cover (not shown) to protect internal components from impact, weather, and other damage. Low voltage lead 418 may attach to a low voltage tap on an adjacent submodule 208 via low voltage tap lead 222 of wiring harness 204.

Embodiments of control box 400 further include an inverter for converting direct current (DC) electricity into alternating current (AC) electricity (e.g., 120 volts or 208 volts at 50 or 60 Hertz). In some embodiments, the inverter converts direct current electricity generated solely by its respective photovoltaic module 200 into alternating current electricity; in other embodiments, the inverter converts direct current electricity generated by a plurality of photovoltaic modules 200 electrically connected to the control box into direct current electricity. Stated differently, in some embodiments, the inverter is powered by a single photovoltaic module 200, and in other embodiments, the inverter is powered by a plurality of photovoltaic modules 200. The inverter may have a single phase or a multi-phase (e.g., three phase) output. By use of an inverter, the integrated harnessing (e.g., wiring harness 204 and/or ground wiring harness 206) can now carry an AC load, thereby possibly reducing the applicability of regulations (e.g., electrical code restrictions) directed to high-power DC circuitry.

Photovoltaic module 200 may also include an inverter that is separate from control box 400. Such inverter, for example, is connected in series between positive node 228 of photovoltaic module 200 and conductor 406 of control box 400.

FIG. 5 is a top plan view of an array 500 of photovoltaic modules 200 of FIG. 2. Array 500 is illustrated as including three photovoltaic modules 200(1), 200(2), and 200(3); however, array 500 can include any quantity of photovoltaic modules 200 that is greater than one. Shown in FIG. 5 are wiring harnesses 204 (represented by solid lines), ground wiring harnesses 206 (represented by dashed lines), and control boxes 400. Two of the photovoltaic modules 200 of FIG. 5 are also illustrated as including a ground connection box 502 to facilitate connection of ground nodes among the photovoltaic modules. As noted above, in some embodiments, the ground wiring harness 206 can be included in the wiring harness 204 where voltage differences between the leads in wiring harness 204 and ground wiring harness 206 do not exceed the limits of the materials used to protect and insulate those leads.

The positive nodes of photovoltaic modules 200 of FIG. 5 are connected via wiring harnesses 204 and control boxes 400 to form a positive node of array 500. Specifically, the positive node of photovoltaic module 200(1) is connected to the positive node of photovoltaic module 200(2) by connecting jumper end 218(1) of wiring harness 204(1) to control box 400(2), and the positive node of photovoltaic module 200(2) is connected to the positive node of photovoltaic module 200(3) by connecting jumper end 218(2) of wiring harness 204(2) to control box 400(3). As illustrated in FIG. 5, the control box interface end 220 of each wiring harness 204 is connected to a respective control box 400. Specifically, interface end 220(1) of wiring harness 204(1) is connected to control box 400(1), interface end 220(2) of wiring harness 204(2) is connected to control box 400(2), and interface end 220(3) of wiring harness 204(3) is connected to control box 400(3). The positive node of array 500 may be connected to an electrical distribution system in order to power a load (e.g., an inverter) via jumper end 218(3) of wiring harness 204(3) or control box 400(1). In any case, the positive node of each photovoltaic module 200 is connected to the desired conductor in wiring harness 204 by internal wiring or switch selection in the control box 400, with selection of the desired conductor dictated by the current limits of each conductor and the number of modules 200 selected to that conductor.

The negative nodes of photovoltaic modules 200 of FIG. 5 are connected via ground wiring harnesses 206 and ground connection boxes 502 to form a negative node of array 500. Specifically, the negative node of photovoltaic module 200(1) is connected to the negative node of photovoltaic module 200(2) by connecting jumper end 226(1) of ground wiring harness 206(1) to ground connection box 502(2), and the negative node of photovoltaic module 200(2) is connected to the negative node of photovoltaic module 200(3) by connecting jumper end 226(2) of wiring harness 206(2) to ground connection box 502(3). As illustrated in FIG. 5, the connection box interface end 224 of each wiring harness 206 may be connected to a ground connection box 502. Specifically, interface end 224(2) of ground wiring harness 206(2) is connected to ground connection box 502(2), and interface end 224(3) of wiring harness 206(3) is connected to ground connection box 502(3). The negative node of array 500 may be connected to an electrical distribution system in order to power a load (e.g., an inverter) via jumper end 226(3) of ground wiring harness 206(3) or interface end 224(1) of ground wiring harness 206(1).

The required lengths of wiring harnesses 204 and ground wiring harnesses 206 are a function of the spacing 504 between adjacent photovoltaic modules 200. For example, spacing 504(1) between photovoltaic modules 200(1) and 200(2) partially determines the required length of wiring harness 204(1) and ground wiring harness 206(1). Wiring harnesses 204 and ground wiring harnesses 206 can be trimmed as appropriate for spacing 504 during installation of photovoltaic modules 200.

Figure 6:
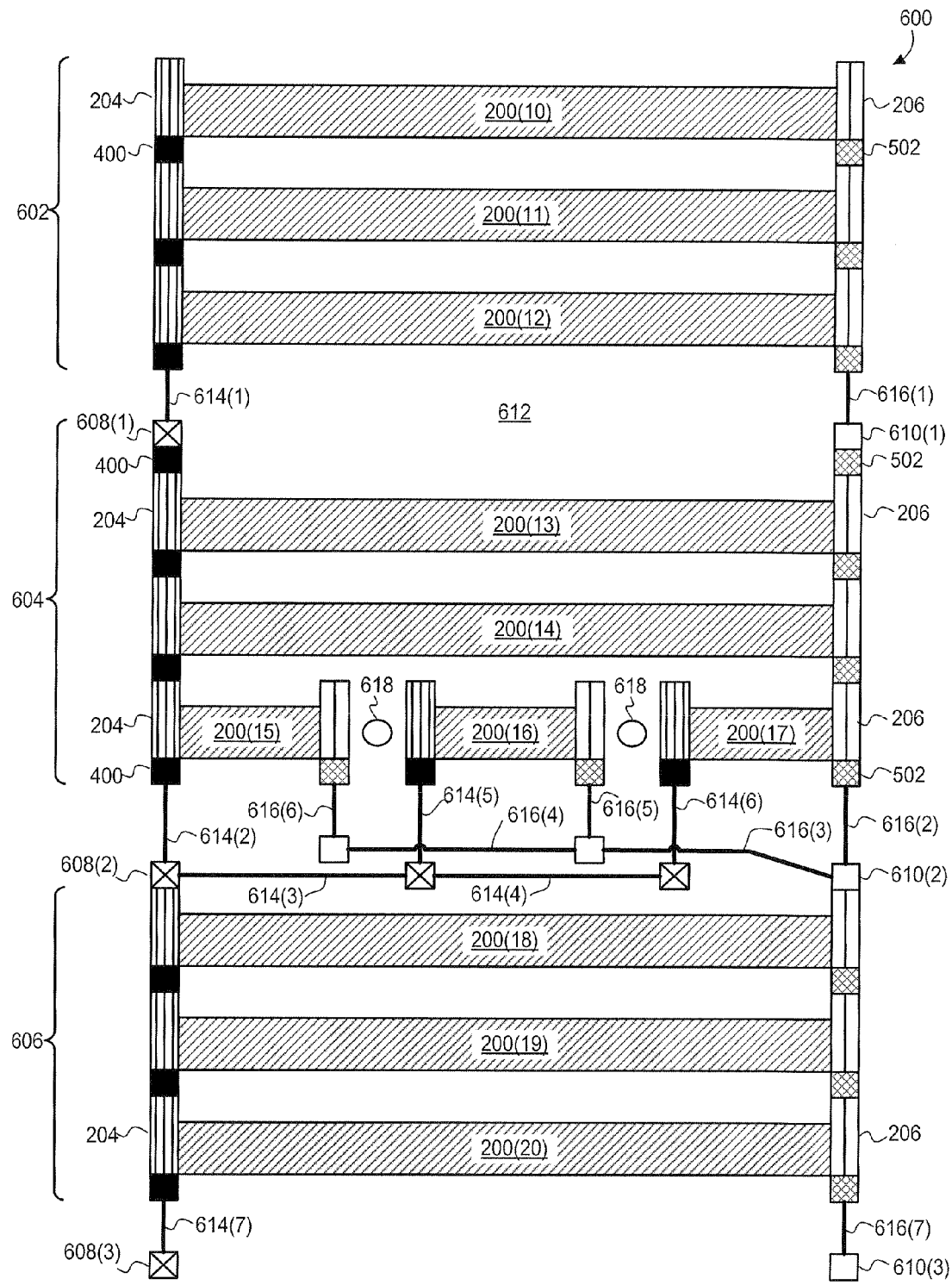
FIG. 6 is a top plan view of one solar power generation system, according to an embodiment.

FIG. 6 is a top plan view of a solar power generation system 600 including a plurality of flexible photovoltaic modules 200. FIG. 6 is described herein with respect to FIGS. 2-5, and may be best understood by considering FIGS. 2-5 together. Solar power generation system 600 is, for example, installed on a building's roof, a vehicle's outer surface, or an outer surface of a tent.

Solar power generation system 600 is illustrated in FIG. 6 as including three arrays 602, 604, and 606 of photovoltaic modules 200. Array 602 is illustrated as including photovoltaic modules 200(10), 200(11), and 200(12); array 604 is illustrated as including photovoltaic modules 200(13), 200(14), 200(15), 200(16), and 200(17); array 606 is illustrated as including photovoltaic modules 200(18), 200(19), and 200(20). However, each array of photovoltaic modules 200 can have any quantity of photovoltaic modules, and solar power generation system 600 can have any quantity of arrays of photovoltaic modules. For example, in another embodiment of solar power generation system 600 (not illustrated), array 602 includes six photovoltaic modules 200, array 604 includes ten photovoltaic modules 200, and array 606 includes six photovoltaic modules 200. Access areas, or paths, 612 may be provided to allow access to photovoltaic modules 200 or for general site (e.g., roof or vehicle surface) maintenance.

In solar power generation system 600, each photovoltaic module includes one wiring harness 204, one control box 400, and one ground wiring harness 206. Again, the wiring harness 204 and ground harness 206 can be combined where regulations (e.g., electric code limits) permit. In FIG. 6, wiring harnesses 204 are illustrated as rectangles with three vertical lines therein; control boxes 400 are illustrated as solid square boxes; and ground wiring harnesses 206 are illustrated as rectangles with one vertical line therein. Each photovoltaic module 200 in solar power generation system 600 also includes one ground connection box 502, which are illustrated in FIG. 6 as having a cross hatch pattern consisting of lines disposed at two different angles.

In a manner like that of FIG. 5, positive nodes of an array photovoltaic modules 200 are electrically connected via wiring harnesses 204 and control boxes 400. Positive nodes of different arrays are, for example, connected via jumpers 614 and junction boxes 608; for example, the positive node of array 602 is connected to the positive node of array 604 via jumper 614(1) and junction box 608(1). However, as discussed below, the positive nodes of two or more arrays, or the positive nodes of two or more photovoltaic modules within an array, are not required to be connected together—embodiments of solar power generation system 600 may include a plurality of positive nodes.

Negative nodes are also connected in a manner like that of FIG. 5. Specifically, negative nodes of an array of photovoltaic modules 200 are connected via ground wiring harnesses 206 and ground connection boxes 502. Negative nodes of different arrays are connected via jumpers 616 and junction boxes 610. For example, the negative node of array 604 is connected to the negative node of array 606 via jumper 616(2) and junction box 610(2).

Jumpers and junction boxes may be used to connect photovoltaic modules 200 in a given array if it is impractical to connect to photovoltaic modules using a wiring harnesses 204 and/or ground wiring harness 206. For example, two photovoltaic modules 200 in an array that are spaced sufficiently far apart such that wiring harnesses 204 and/or ground wiring harnesses 206 are too short to bridge the separation will need to be connected using one or more jumpers and/or junction boxes. As an example, FIG. 6 illustrates array 604 as including relatively short photovoltaic modules 200(15), 200(16) and 200(17) disposed around obstacles 618. These photovoltaic modules are disposed such that it would not be practical to connect them via wiring harnesses 204 and ground wiring harnesses 206. Accordingly, the positive nodes of these photovoltaic modules are connected via jumpers 614 and junction boxes 608, and the negative nodes are connected via jumpers 616 and junction boxes 610.

Junction box 608(3) provides access to the one or more positive node of solar power generation system 600 and junction box 610(3) provides access to the negative node of solar power generation system 600. For example, a load may be connected across junction boxes 608(3) and 610(3); such load may include an inverter if one is not already incorporated into the control boxes 400. It should be noted, however, that a load may connected to solar power generation system 600 at other points, and the quantity and configuration of junction boxes 608 and 610 as well as jumpers 614 and 616 is a design choice that will be influenced by various factors including the installation site of solar power generation system 600 and/or local building codes. Metallic or non-metallic shielding may be provided to protect wiring harnesses 204, ground wiring harness 206, jumpers 614, 616, as well as any other wiring that might be exposed to damage, for example due to footfall, abrasion, or harsh weather, and as may be required by applicable building codes. These requirements can vary depending upon if the harnesses 204 and 206 carry DC or AC power.

Each full-sized photovoltaic module 200 in solar power generation system 600 generates a specific current, and each flexible circuit of system 600, which is partially defined by a conductor 216 of wiring harnesses 204, has a desired current rating commensurate with the needs of the load (e.g., an inverter) powered by system 600. Photovoltaic modules 200 of system 600 may be sized according to country-specific standards without departing from scope hereof.

As stated above, wiring harness 204 may include a plurality of conductors 216 and thereby support a corresponding plurality of circuits, where each conductor 216 forms part of a separate circuit. It may be desirable for solar power generation system 600 to include a plurality of circuits if the magnitude of electric current generated by solar power generation system 600 is sufficiently large to make it impractical to carry the entire magnitude via a single circuit. Furthermore, regulations (e.g., building codes) may limit the maximum current that a single circuit can handle. For example, building codes may limit a circuit's maximum current to 60 amperes ("A"). Additionally, it may be more practical to power some loads with a plurality of circuits rather than with a single circuit. For example, a load consisting of a three phase inverter may have three isolated inputs which may be conveniently powered by three separate circuits.

Positive nodes of multiple photovoltaic modules 200 may be connected to the same conductor 216 and thereby to the same circuit, limited only by the current rating of the conductor and circuit. Embodiments of solar power generation system 600 include a plurality of circuits, such as three circuits. In such embodiments of system 600 having three circuits, the various photovoltaic modules 200 may be distributed among these three circuits. For example, the positive nodes of each photovoltaic module 200 of array 602 may be connected together to partially form a first circuit, the positive nodes of each photovoltaic module 200 of array 604 may be connected together to partially form a second circuit, and the positive nodes of each photovoltaic module 200 of array 606 may be connected together to partially form a third circuit. As discussed above, embodiments of control box 400 allow the positive node of a respective photovoltaic module 200 to be connected to a specific circuit simply by adjusting selector switch 414 as appropriate. For example, a plurality of photovoltaic modules 200 may be connected to a common circuit by setting the selector switch 414 in their respective control boxes 400 to the same position.

Figure 7:
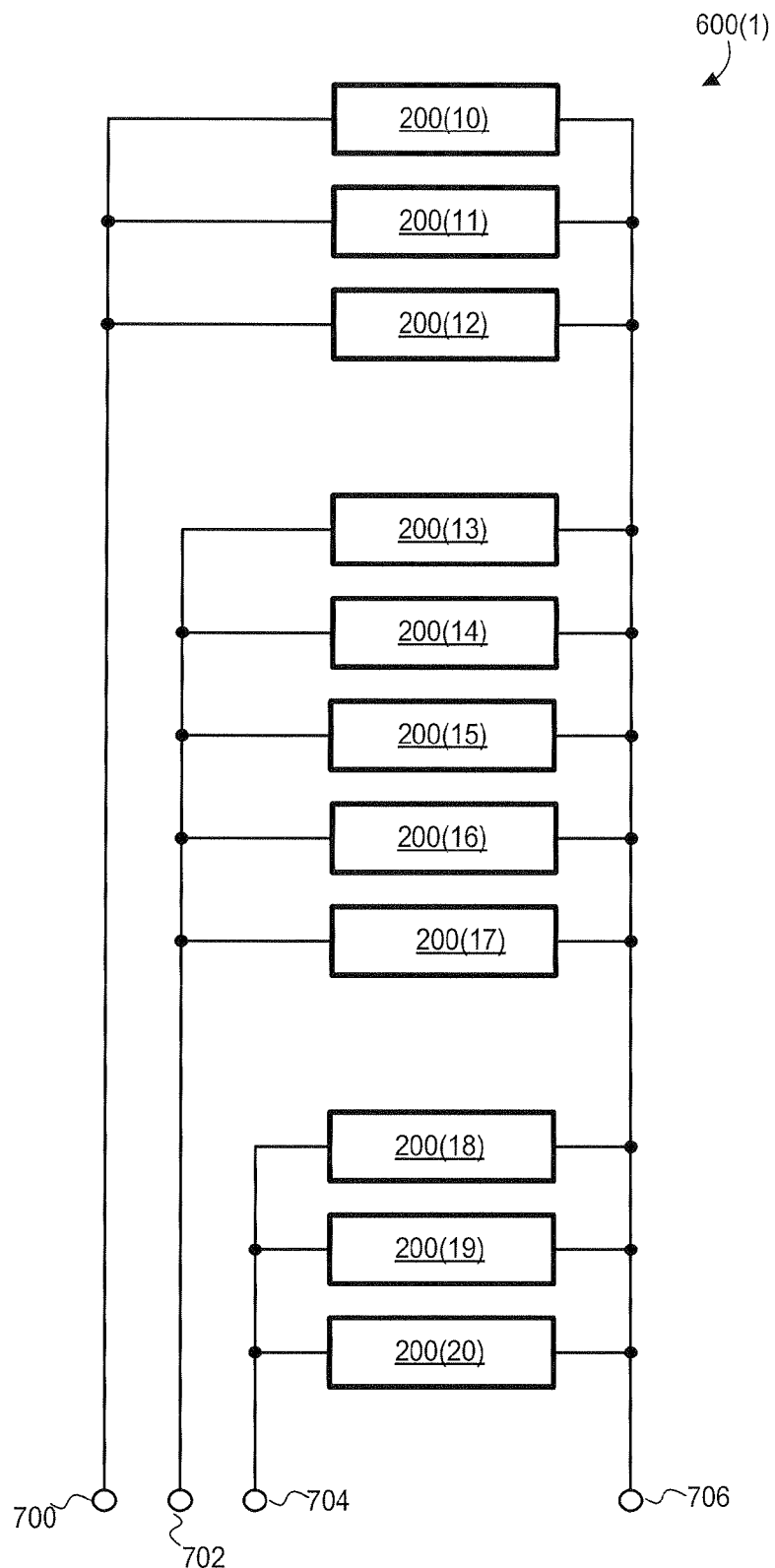
FIG. 7 is an electrical schematic of one three circuit embodiment of the solar power generation system of FIG. 6.

FIG. 7 is an electrical schematic of one three circuit embodiment of a solar power generation system 600(1). Solar power generation system 600(1) has three positive nodes 700, 702, and 704; such positive nodes, along with balance of system components and common negative node 706, form three circuits. In this embodiment, the positive nodes of photovoltaic modules 200 of array 602 are connected to positive node 700, the positive nodes of photovoltaic modules 200 of array 604 are connected to positive node 702, and the positive nodes of photovoltaic modules 200 of array 606 are connected to positive node 704. In order to support these three circuits, wiring harnesses 204 and jumpers 614 in this embodiment include three conductors, each of which corresponds to a separate one of the three positive nodes or circuits.

Photovoltaic modules 200 of solar power generation system 600 may be modified to conform to features of an installation site. For example, if solar power generation system 600 is installed on a rooftop, vents or other obstacles 618 may prevent full-sized photovoltaic modules from being installed over the entire rooftop. Photovoltaic modules 200 may be modified to include small or custom sized photovoltaic modules, such as photovoltaic modules 200(15), 200(16), and 200(17) as illustrated in FIG. 6. Such small or custom sized photovoltaic modules may be manufactured to provide the same output voltage as a full-size photovoltaic module 200, although the small or custom sized modules may have a smaller current rating than the full size modules. For example, each photovoltaic module 200 in solar power generation system 600 may have the same open circuit output voltage, regardless of its dimensions.

Figure 8:
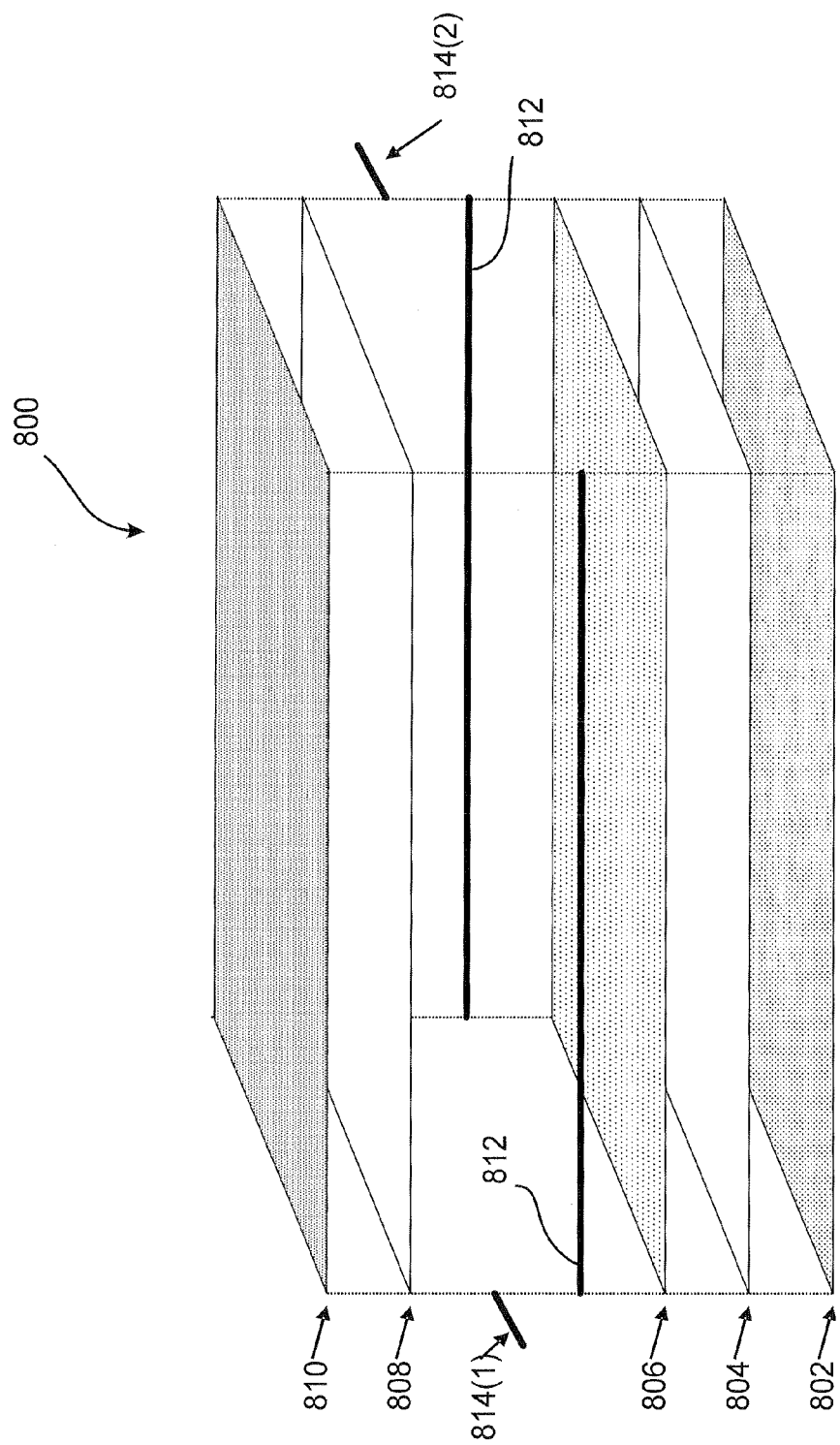
FIG. 8 is an exploded side view of one flexible photovoltaic module, according to an embodiment.

FIG. 8 is an exploded side view of a flexible photovoltaic module 800. Photovoltaic module 800 is an embodiment of photovoltaic module 102 of FIG. 1. Additionally, a wiring harness 204 and/or a ground wiring harness 206 may be added to photovoltaic module 800 to form an embodiment of photovoltaic module 200 of FIG. 2.

Photovoltaic module 800 includes a base or backplane layer 802, for mounting with an installation site. Backplane layer 802 is strong, flexible, and resistant to thermal and environmental damage. Backplane layer 802 may, for example, protect the layers of photovoltaic module 800 from thermal and environmental stress. Backplane layer 802 may include or provide connection to a fastener for attaching photovoltaic module 800 to a support structure, such as support structure 1102 of FIG. 11. Exemplary fasteners include, but are not limited to, an adhesive, tape, screws, nails, straps or snaps, and hook and loop fasteners. Backplane layer 802 may be any suitably flexible material, such as stainless steel sheeting, plastic, or a polymer.

First pottant layer 804 overlies backplane layer 802 and supports a photovoltaic submodule assembly 806. First pottant layer 804 and a second pottant layer 808 form an airtight seal around photovoltaic submodule assembly 806 to prevent air from being trapped near active devices (e.g., submodules or photovoltaic cells) of photovoltaic submodule assembly 806. Second pottant layer 808 is optically transparent to allow light to reach active devices of photovoltaic submodule assembly 806. First pottant layer 804 may be sticky or tacky to facilitate adhesion of module backplane layer 802 to pottant layer 804. Similarly, second pottant layer 808 may be sticky or tacky to facilitate adhesion of transparent top layer or upper laminate layer 810 to second pottant layer 808.

In one embodiment of photovoltaic module 800, first pottant layer 804 and second pottant layer 808 are formed of materials such as ethylene vinyl acetate (EVA) or polyvinyl butyral (PVB) and are applied as sheets or sprayed onto photovoltaic submodule assembly 806. In such embodiment, backplane layer 802 and photovoltaic submodule assembly 806 are sealed to the pottant layers (e.g., by pressure or by vacuum or non-vacuum lamination). In another embodiment of photovoltaic module 800, first pottant layer 804 and second pottant layer 808 are protective laminates applied to photovoltaic submodule assembly 806 with sufficient pressure or vacuum to seal the laminates without damage to photovoltaic submodule assembly 806.

Additives may be combined with the pottant layer material to increase cut, puncture, or abrasion resistance. Additives may likewise be incorporated into the pottant layer material to change its aesthetic appearance, increase its sealing properties, provide cut resistance, or enhance overall module stability and/or performance. Transparent top or upper laminate layer 810 protects photovoltaic module 800 from wear and tear and environmental stresses such as weather, ultraviolet radiation, dirt, and debris. Upper laminate layer 810 may be formed from a suitable polymer, plastic, or other transparent, protective material, and may be applied by lamination or by spraying. In one embodiment of photovoltaic module 800, transparent upper laminate layer 810 is an outer surface of second pottant layer 808.

Figure 9:
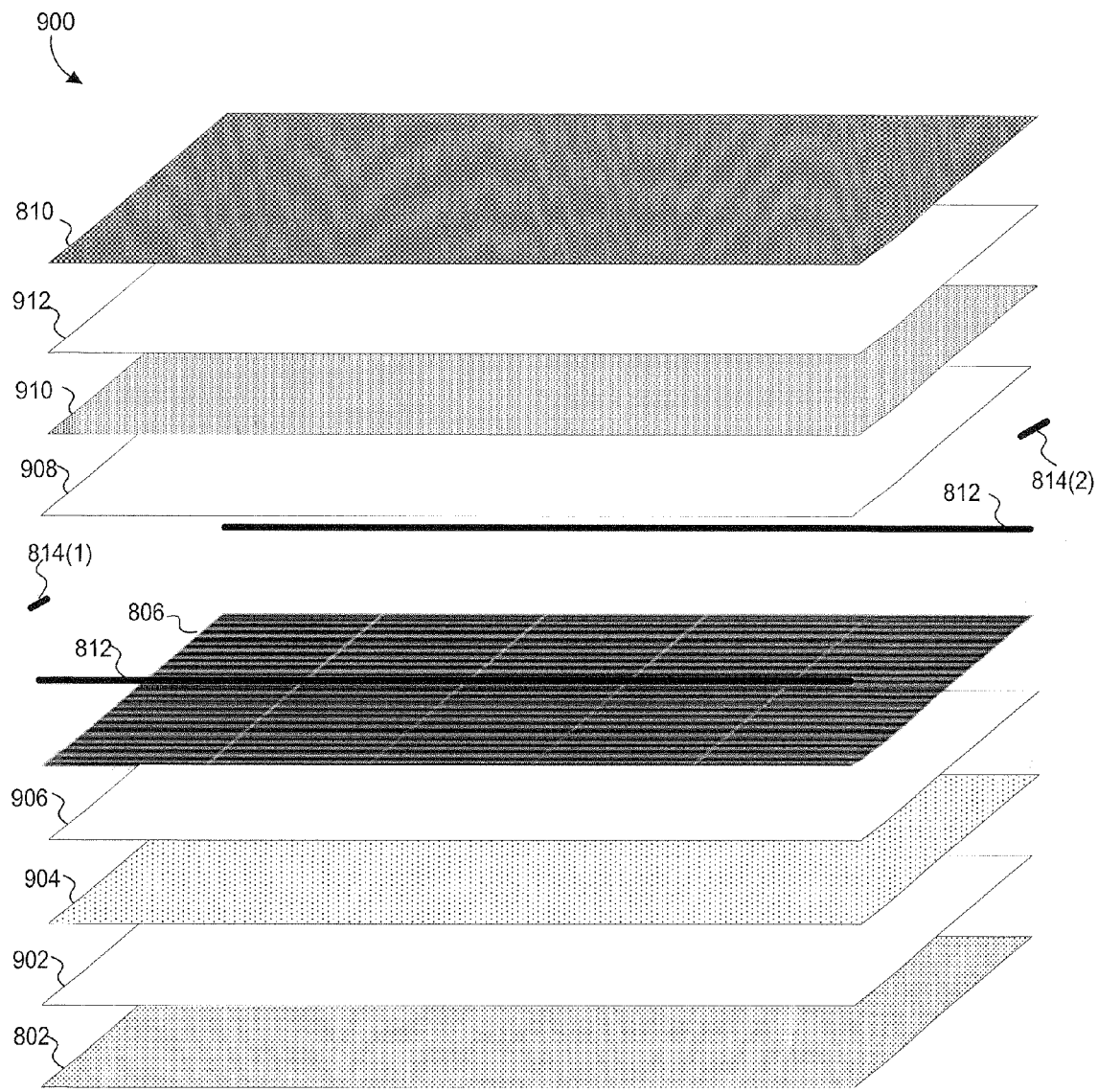
FIG. 9 is an exploded side view of one flexible photovoltaic module, according to an embodiment.

Optionally, layers of additive may be sandwiched between pottant layers on either side of photovoltaic submodule assembly 806. For example, FIG. 9 shows an exploded side view of a flexible photovoltaic module 900, which is an embodiment of photovoltaic module 800. Photovoltaic submodule 900 includes four pottant sublayers and two additive layers. Pottant sublayer 902 is formed on base layer 802, additive layer 904 is formed on pottant sublayer 902, and pottant sublayer 906 is formed on additive layer 904. Additionally, pottant sublayer 908 is formed on photovoltaic submodule assembly 806, additive layer 910 is formed on pottant sublayer 908, and pottant sublayer 912 is formed on additive layer 910.

Photovoltaic submodule assembly 806 includes a plurality of thin-film, monolithically-integrated photovoltaic cells (not shown). Such photovoltaic cells may be grouped into photovoltaic submodules. These thin-film photovoltaic cells may be produced by one or more of the following thin-film technologies: copper-indium-gallium-selenium (CIGS), copper-indium-aluminum-selenium (CIAS), copper-indium-gallium-aluminum-selenium (CIGAS), copper-indium-gallium-aluminum-selenium-sulphur (CIGASS), copper-indium-gallium-selenium-sulfur (CIGSS), cadmium-telluride (CdTe), amorphous silicon (a-Si), or combinations thereof.

In one embodiment, photovoltaic submodule assembly 806 is a solar "blanket" with five or fewer monolithically integrated, interconnected CIGS cell photovoltaic submodules.

Figure 10:
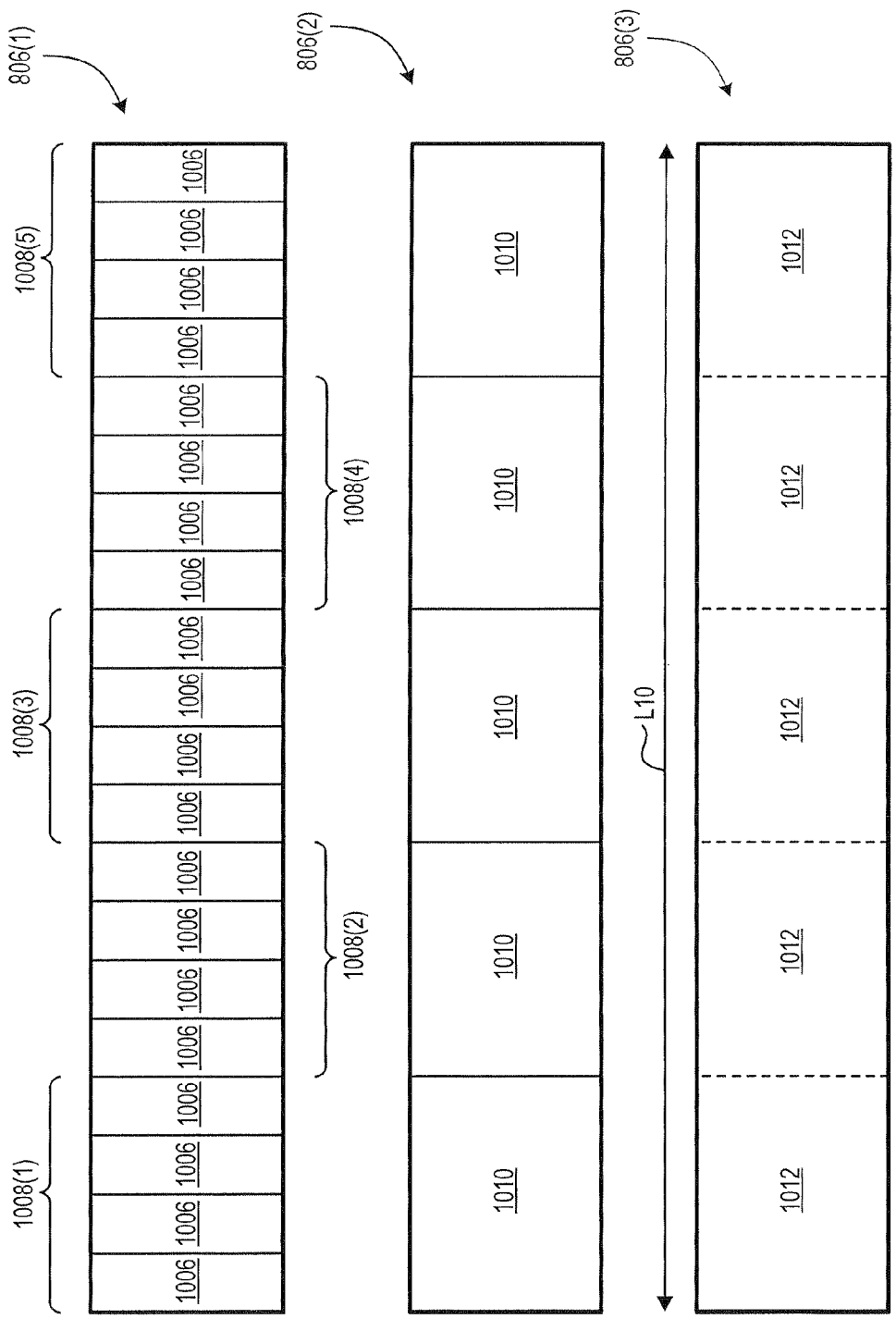
FIG. 10 schematically shows three embodiments of the photovoltaic submodule assembly of FIGS. 8 and 9.

The photovoltaic submodules are connected to achieve a final desired maximum current capability and a selected open circuit output voltage, which may be the end voltage of each submodule or the sum of the open circuit output voltage of each photovoltaic submodule. The photovoltaic submodules are, for example, 120 volt photovoltaic submodules interconnected to yield a 600 volt photovoltaic submodule assembly 806. Other possible photovoltaic submodule arrangements and outputs are shown in FIG. 10, as discussed below. The amount of power provided by photovoltaic submodule assembly 806 may vary according to user needs or building codes.

Photovoltaic submodule assembly 806 is electrically connected by conductive bus bars 812. Bus bars 812 collect current from one or more photovoltaic submodules and direct it to conductive lead 814(1), which serves a connection to the positive node of photovoltaic submodule assembly 806, and conductive lead 814(2), which serves a connection to the negative node (e.g., ground) of photovoltaic submodule assembly 806. Bus bars 812 may also interconnect photovoltaic submodules within photovoltaic submodule layer 806 in series and/or parallel. The actual quantity and configuration of bus bars 812 will vary as a function of the quantity, size, and electrical interconnection of photovoltaic submodules within submodule assembly 806.

In one embodiment, an instance of wiring harness 204 is partially embedded in photovoltaic module 800 by disposing flexible electrical conductors 216 of the wiring harness laterally along the edge of photovoltaic submodule assembly 806. Such electrical conductors are electrically isolated from the submodules and bus bars of photovoltaic submodule assembly 806.

The size and shape of photovoltaic module 800 may be modified by computer-aided design to fit the needs of a specific installation site while maintaining appropriate electrical characteristics for the photovoltaic module. In an embodiment of photovoltaic module 800 to be installed on a roof, the roof is measured and an array of photovoltaic modules 800 is designed for maximum coverage of the roof. Photovoltaic modules 800 are manufactured in a variety of custom sizes (e.g., fitted to optimally surround any obstructions), for example using laser patterning. Where the roof is free from obstructions, photovoltaic modules may be manufactured as long as regulations (e.g., building codes) allow (e.g., a maximum length of one hundred and fifty feet) and rolled up for easy transportation and placement (un-rolling) on the roof. Photovoltaic module 800 may be significantly lighter and more flexible than a photovoltaic module of corresponding length made with existing crystalline technology or technology involving integrating thin film on rigid substrates. Such crystalline or rigid modules would not only be very heavy, but extremely difficult to transport or install.

It will be understood that photovoltaic module 800's dimensions are customizable and if the module is used in a building, its dimensions may vary depending upon U.S. and foreign building codes. For example, building codes may limit a maximum current capability of a photovoltaic module to 10 amperes; in such case, the surface area of the photovoltaic module may be limited such that the 10 amperes maximum current rating is not exceeded.

Where a length of an installation site has obstructions, various sized photovoltaic modules 800 are prepared to optimally cover the surface area around the obstruction. Such variable-sized photovoltaic modules maintain a consistent open circuit output voltage, and may therefore interconnect in parallel to adjacent photovoltaic modules, without requiring series connection. In one example where photovoltaic modules 800 are installed on a 150 foot long roof, the roof has two five-foot square vents placed twenty feet from each end of the roof and one eight-foot square skylight centered between the two vents. Two twenty foot long modules and two forty-six foot long modules may be prepared to cover the 132 feet of unobstructed roof and maintain a consistent open circuit output voltage when interconnected in parallel.

FIG. 10 schematically shows three embodiments of photovoltaic submodule assembly 806 of FIGS. 8 and 9. Photovoltaic submodule assembly 806(1) includes a plurality of discrete narrow web photovoltaic submodules 1006 that are physically and electrically interconnected. Each photovoltaic submodule 1006 includes a plurality of photovoltaic cells electrically connected in series to obtain a desired open circuit output voltage (e.g., 120 volts) of the photovoltaic submodule. Photovoltaic submodules 1006 may be electrically connected in series and/or parallel such that photovoltaic submodule assembly 806(1) is operable to provide a desired open circuit voltage and a desired maximum current capability. For example, FIG. 10 shows photovoltaic submodules 1006 grouped into groups 1008(1), 1008(2), 1008(3), 1008(4) and 1008(5), each of which includes four photovoltaic submodules 1006 electrically connected in parallel to increase the maximum current capability of the group. Each of groups 1008 are themselves electrically connected in series to increase the open circuit output voltage of photovoltaic submodule assembly 806(1).

Photovoltaic submodule assembly 806(2) includes a plurality of discrete wide web separate photovoltaic submodules 1010, which are physically and electrically interconnected. Each photovoltaic submodule 1010 includes a plurality of photovoltaic cells electrically connected in series such that each photovoltaic submodule 1010 has a desired open circuit output voltage (e.g., 120 volts). Photovoltaic submodules 1010 may be electrically connected in parallel or series. An embodiment of photovoltaic submodule layer 806(2) has five photovoltaic submodules 1010, each of which has an open circuit voltage of 120 volts. The five photovoltaic submodules 1010 in this embodiment are electrically connected in series such that photovoltaic submodule assembly 806(2) has an open circuit voltage of 600 volts. Photovoltaic submodule assembly 806(2) may be more economical to manufacture than photovoltaic submodule assembly 806(1) because photovoltaic submodule assembly 806(2) has fewer submodules than photovoltaic submodule assembly 806(1).

Photovoltaic submodule assembly 806(3) of FIG. 10 includes a plurality of photovoltaic submodules 1012 monolithically integrated on a common substrate. Photovoltaic submodule assembly 806(3) is a contiguous structure with a maximum length L10 that is limited by constraints of the application (e.g., length of a roof section), regulations (e.g., building codes), and/or the circuit it is to be connected to. Photovoltaic submodules 1012 are illustrated as being partially delineated by dashed lines to indicate that photovoltaic submodules 1012 are monolithically integrated onto a common substrate. Photovoltaic submodule assembly 806(3) may be more economical to manufacture than photovoltaic submodule assemblies 806(1) and 806(2) because photovoltaic submodule assembly 806(3) is formed of one contiguous component while photovoltaic submodule assemblies 806(1) and 806(2) require the assembly of a plurality of photovoltaic submodules.

Each photovoltaic submodule 1012 of photovoltaic submodule assembly 806(3) includes a plurality of photovoltaic cells electrically connected in parallel and/or series in order to provide a desired open circuit output voltage and maximum current capability of the photovoltaic submodule assembly 806(3). An embodiment of photovoltaic submodule assembly 806(3) includes five photovoltaic submodules electrically connected in series, where each photovoltaic submodule has an open circuit voltage of 120 volts such that the photovoltaic submodule assembly has an open circuit voltage of 600 volts.

A multitude of monolithic integration patterns may be implemented in photovoltaic submodule assembly 806(3) to achieve a desired open circuit output voltage and maximum current capability. The monolithic integration pattern may be selected in accordance with factors such as the desired open circuit output voltage and maximum current capability of photovoltaic submodule assembly 806(3), the desired dimensions of photovoltaic submodule assembly 806(3), and/or the materials the photovoltaic cells are formed of. Monolithic integration of photovoltaic cells of photovoltaic submodule assembly 806(3) may be computer controlled. In such case, the monolithic integration process may be automatically configured and controlled by computer hardware and/or software used to design a solar power generation system (e.g., solar power generation system 600) such that the monolithic integration process corresponds to the solar power generation system design. Submodule scribes can be placed either along the web transport direction, perpendicular to it, or a combination of the above. Photovoltaic submodule size can be the size of the entire photovoltaic submodule assembly 806(3); alternately, photovoltaic submodule assembly 806(3) can be scribed into smaller photovoltaic submodules to mitigate the impact of damage (puncture, impact, etc.) to a section of photovoltaic submodule assembly 806(3). The orientation of photovoltaic submodules within photovoltaic submodule assembly 806(3) can be optimized through cost modeling to provide the most efficient manufacturing process, and can accommodate separate photovoltaic submodules or photovoltaic submodules formed on a common substrate.

Embodiments of photovoltaic submodule assemblies 806 (1), 806(2), and 806(3) may be custom constructed with desired dimensions. Although various embodiments of photovoltaic submodule assemblies 806(1), 806(2), and 806(3) may have different dimensions, each embodiment may be constructed to have essentially the same open circuit output voltage.

Figure 11:
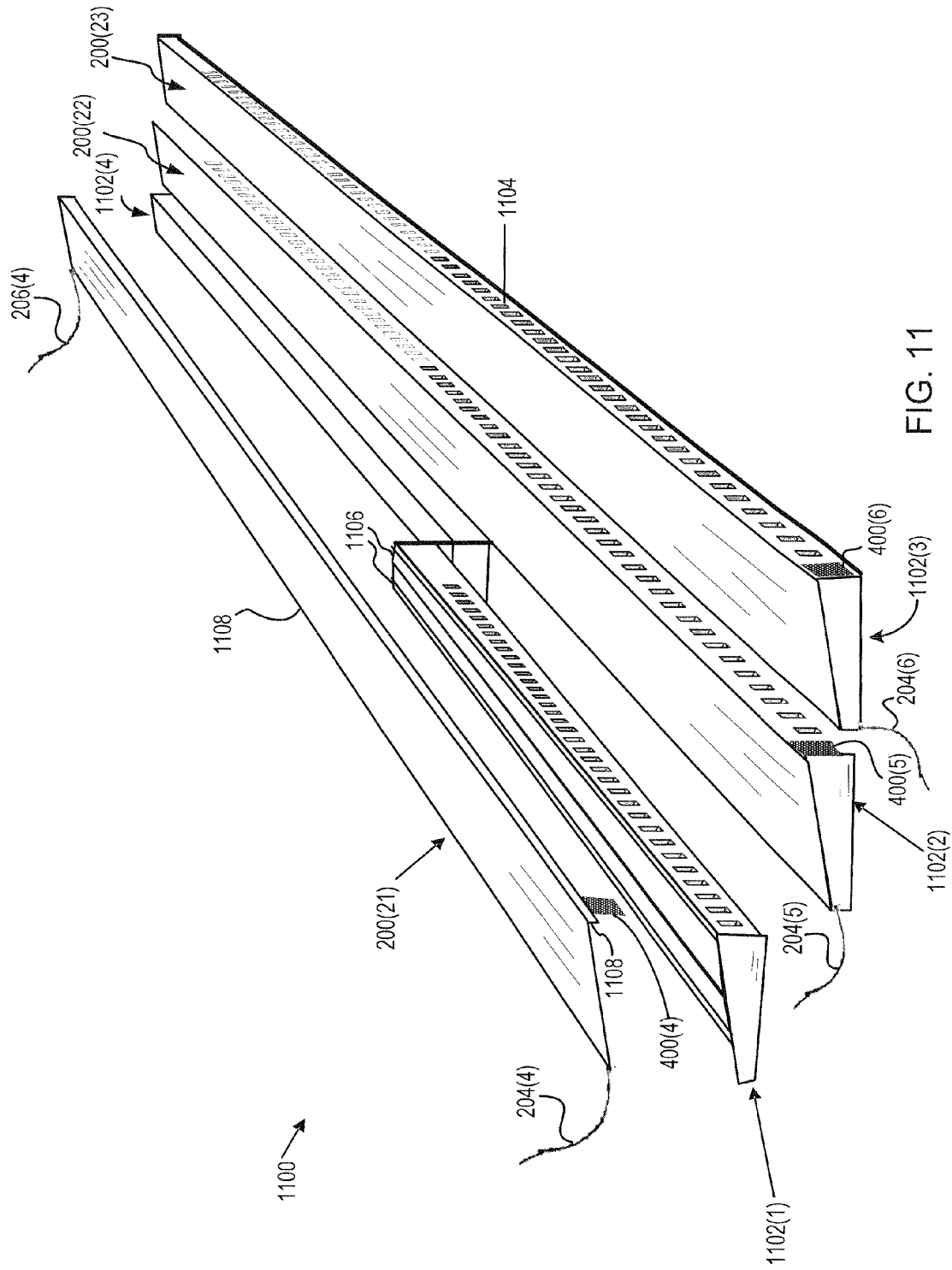
FIG. 11 is an exploded perspective view of one solar power generation system, according to an embodiment.

FIG. 11 is an exploded perspective view of a solar power generation system 1100. Solar power generation system 1100 includes one or more supporting structures 1102 supporting one or more photovoltaic modules 200. For example, solar power generation system 1100 may include supporting structures 1102(1) and 1102(4) supporting photovoltaic module 200(21), supporting structure 1102(2) supporting photovoltaic module 200(22), and supporting structure 1102(3) supporting photovoltaic module 200(23).

Supporting structures 1102 are formed of a sufficiently supportive material that is acceptable for the application (e.g., complies local building codes if the supporting structures are used on a building). For example, supporting structures 1102 may be formed of foam, metal, wood, or plastic. Supporting structures 1102, for example, include slots or holes 1104, which may serve to ventilate supporting structures 1102, reduce wind lift of supporting structures 1102, and/or provide a passage for low-voltage leads for sensors, antennas, etc.

In one embodiment, supporting structures 1102 are shaped in wedges to angle mounted photovoltaic modules 200 with respect to the surface they are installed on (e.g., a roof) for optimal capture of incident sunlight. Supporting structures 1102 may be light and transportable in large sections that are limited in size only by limitations of the selected transportation method. Photovoltaic modules 200 are for example transported to the installation site in rolls and unrolled into place upon supporting structures 1102. Control boxes 400 may mount on supporting structures 1102 for support and easy access to control box components. Ground connection boxes 502 (not shown in FIG. 11) may also mount on supporting structures 1102.

Figure 12:
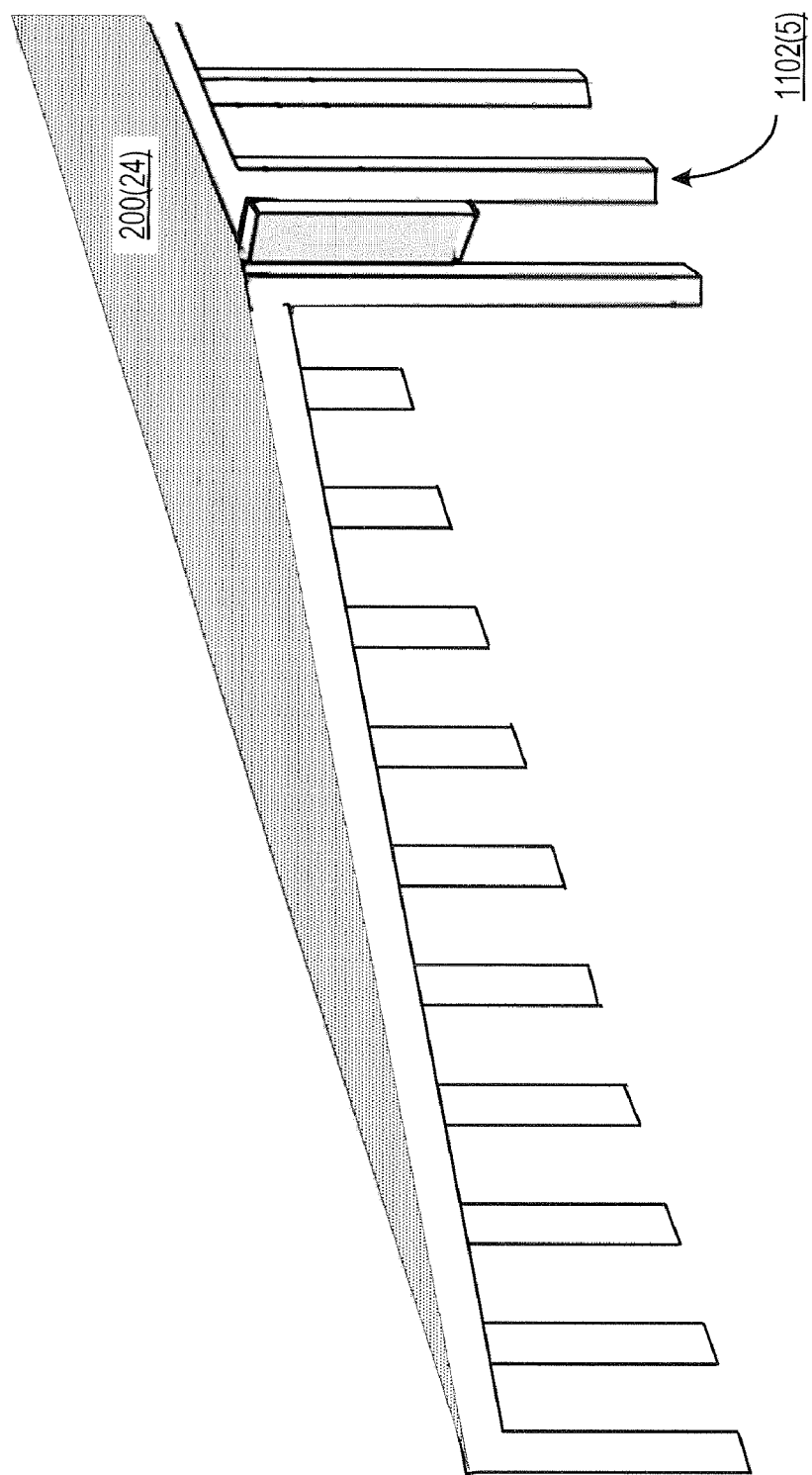
FIG. 12 is a side perspective view of one supporting structure, according to an embodiment.

Other embodiments of supporting structure 1102 may include a frame constructed with suitable building materials (e.g., metals, or non-metallic materials such as wood) or may be created by spraying or otherwise depositing insulating roofing materials around sacrificial spacers on the roof to provide a contiguous structure with multiple surfaces upon which to mount photovoltaic modules 200. For example, FIG. 12 is a side perspective view of supporting structure 1102(5), which is formed of a metal (e.g., aluminum) frame. Supporting structure 1102(5) is illustrated in FIG. 12 as supporting photovoltaic module 200(24).

Embodiments of photovoltaic modules 200 are fastenable to supporting structures 1102. Examples of materials that may be used to fasten photovoltaic modules 200 to supporting structures 1102 include hook and loop fasteners, screws, adhesives, zip lock fasteners, or other fasteners (e.g., fasteners acceptable under local building codes when supporting structures 1102 are installed on a building). In one embodiment, connection flaps 1108 secure photovoltaic modules 200 to supporting structures 1102. Connection flaps 1108 are, for example, hook and loop fasteners or extensions of the substrate of photovoltaic modules 200 with adhesive on the backplane side, that connect to receiving strips or areas 1106 of supporting structures 1102. Wiring harnesses 204 may interconnect and ground wiring harnesses 206 may interconnect—such interconnections may be accomplished using crimp connections, bolt or screw connectors, push-in connectors, soldering or brazing. The flexible conductors 216 of wiring harnesses 204 may connect to inverters or a switch via control box 400(6), e.g., to facilitate rapid power cutoff if required by local codes.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

What is claimed is:

1. A photovoltaic array, comprising:
   a flexible first photovoltaic module for converting light into electricity, the first photovoltaic module having a positive node for supplying electric current to a load and a negative node for receiving electric current from the load, the first photovoltaic module including a first wiring harness having a plurality of flexible electrical conductors, each electrical conductor being electrically isolated from each other electrical conductor within the first wiring harness, the positive node of the first photovoltaic module being electrically connected to one of the electrical conductors of the first wiring harness, the remaining electrical conductors of the first wiring harness being electrically isolated from the positive and negative nodes of the first photovoltaic module; and
   a flexible second photovoltaic module for converting light into electricity, the second photovoltaic module having a positive node for supplying electric current to a load and a negative node for receiving electric current from the load, the second photovoltaic module including a second wiring harness having a plurality of flexible electrical conductors corresponding to the electrical conductors of the first wiring harness, each electrical conductor being electrically isolated from each other electrical conductor within the second wiring harness, the positive node of the second photovoltaic module being electrically connected to one of the electrical conductors of the second wiring harness, the remaining electrical conductors of the second wiring harness being electrically isolated from the positive and negative nodes of the second photovoltaic module, and the electrical conductors of the first wiring harness being electrically connected to the corresponding electrical conductors of the second wiring harness.

2. The photovoltaic array of claim 1, the positive node of the first photovoltaic module being electrically connected to a first electrical conductor of the first wiring harness, the positive node of the second photovoltaic module being electrically connected to a second electrical conductor of the second wiring harness, the first electrical conductor being electrically isolated from the second electrical conductor.

3. The photovoltaic array of claim 1, the first and second photovoltaic modules each comprising at least one submodule, each submodule comprising a plurality of interconnected photovoltaic cells.

4. The photovoltaic array of claim 1, wherein:
the first photovoltaic module has a first length and a first open circuit output voltage,
the second photovoltaic module has a second length and a second open circuit output voltage,
the first length is different from the second length, and
the first open circuit output voltage is substantially equal to the second open circuit output voltage.

5. The photovoltaic array of claim 1, the first photovoltaic module comprising a control box, the control box connecting the electrical conductors of the first wiring harness to the corresponding electrical conductors of the second wiring harness, the control box being operable to selectively electrically connect the positive node of the first photovoltaic module to any one of the electrical conductors of the first wiring harness.

6. The photovoltaic array of claim 5, the control box comprising a quick-connect wiring connector connecting the conductors of the second wiring harness to the control box.

7. The photovoltaic array of claim 1, further comprising at least one supporting structure for supporting at least one of the first and second photovoltaic modules.

8. The photovoltaic array of claim 7, the supporting structure comprising at least one foam support substantially having a wedge-shaped.

9. The photovoltaic array of claim 7, the supporting structure comprising a metallic frame.

10. The photovoltaic array of claim 7, at least one of the first and second photovoltaic modules comprising fasteners for fastening to the photovoltaic module to the supporting structure.

11. The photovoltaic array of claim 10, the fasteners selected from the group consisting of tape, hook and loop fasteners, adhesive tabs, straps, snaps, and slides.

12. The photovoltaic array of claim 1, the first photovoltaic module further comprising a first ground wiring harness having a first ground conductor, the negative node of the first photovoltaic module being electrically connected to the first ground conductor, the second photovoltaic module further comprising a second ground wiring harness having a second ground conductor, the negative node of the second photovoltaic module being electrically connected to the second ground conductor, the second ground conductor being electrically connected to the first ground conductor.

13. The photovoltaic array of claim 12, the first and second ground conductors being electrically connected by a ground connection box.

14. The photovoltaic array of claim 1, further comprising an inverter for converting direct current electricity produced by least one of the first and second photovoltaic modules into alternating current electricity.

* * * * *

UNITED STATES PATENT AND TRADEMARK OFFICE
CERTIFICATE OF CORRECTION

| | | |
|---|---|---|
| PATENT NO. | : 7,812,247 B2 | Page 1 of 1 |
| APPLICATION NO. | : 11/877625 | |
| DATED | : October 12, 2010 | |
| INVENTOR(S) | : Joseph H. Armstrong et al. | |

It is certified that error appears in the above-identified patent and that said Letters Patent is hereby corrected as shown below:

Column 1, Line 29, "roofs" should read --roof's--;
Column 2, Line 11, "roofs" should read --roof's--;
Column 5, Line 14, "need connect" should read --need to connect--;
   Line 29, "may" should read --may be--;
Column 6, Line 58, "tap is" should read --tap in--;
Column 12, Line 28, "may" should read --may be--;
Column 20, Line 11, "wedge-shaped" should read --wedge-shape--;
   Line 36, "by least" should read --by at least--.

Signed and Sealed this
Eighth Day of March, 2011

David J. Kappos
*Director of the United States Patent and Trademark Office*